US012628301B2

(12) United States Patent
Tu et al.

(10) Patent No.: US 12,628,301 B2
(45) Date of Patent: May 12, 2026

(54) ELECTRONIC MODULE RETENTION ASSEMBLY TO RELEASABLY SECURE AN ELECTRONIC MODULE TO AN INFORMATION PROCESSING DEVICE

(71) Applicant: HEWLETT PACKARD ENTERPRISE DEVELOPMENT LP, Spring, TX (US)

(72) Inventors: Wei-Chen Tu, Taipei (TW); Peng ChiangHsieh, Taipei (TW); Chi-Ting Yang, Taipei (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 204 days.

(21) Appl. No.: 18/650,472

(22) Filed: Apr. 30, 2024

(65) Prior Publication Data

US 2025/0338420 A1      Oct. 30, 2025

(51) Int. Cl.
*H05K 7/14*          (2006.01)
*G06F 1/183*        (2026.01)
(52) U.S. Cl.
CPC ........... *H05K 7/1402* (2013.01); *G06F 1/183* (2013.01)
(58) Field of Classification Search
CPC .... H05K 7/1402; H05K 7/1409; G06F 1/183; G06F 1/185; G06F 1/186
See application file for complete search history.

(56) References Cited

U.S. PATENT DOCUMENTS 9,134,772 B2 * 9/2015 Zhang ..................... G06F 1/187
9,214,749 B2 * 12/2015 Li .................... H01R 13/62944
9,703,333 B1 * 7/2017 Harting ................... G06F 1/187
9,880,593 B2 1/2018 Ent et al.
10,609,835 B1 * 3/2020 Liu ...................... H05K 7/1487
(Continued)

FOREIGN PATENT DOCUMENTS

WO        2021/164444 A1      8/2021

OTHER PUBLICATIONS

IBM, "Permanently Removing a PCIe Adapter from the EMXO PCIe3 Expansion Drawer," Jun. 22, 2023, 6 pages.
(Continued)

*Primary Examiner* — Imani N Hayman
*Assistant Examiner* — Hung Q Dang
(74) *Attorney, Agent, or Firm* — Hewlett Packard Enterprise Patent Department

(57)                    ABSTRACT

An electronic module retention assembly including an actuator tab and a retention arm, to releasably secure an electronic module to an information processing device is disclosed. The retention arm includes linear gear teeth, configured to be movably coupled to a vertical support panel of the device and configured to slide along the vertical support panel. The retention arm extends from first to second end portions. The first end portion includes circular gear teeth, and the second end portion includes an attachment element configured to releasably couple to the electronic module. The retention arm being pivotably coupled to the vertical support panel and mounted on a face of the actuator tab such that the circular and linear gear teeth are engaged with each other, and a sliding movement of the actuator tab causes rotation of the retention arm between deployed and stowed positions to secure and release the electronic module, respectively.

20 Claims, 14 Drawing Sheets

(56)        References Cited

U.S. PATENT DOCUMENTS

| | | | |
|---|---|---|---|
| 10,912,696 B2 * | 2/2021 | Staudinger | A61G 13/02 |
| 11,068,033 B2 | 7/2021 | Pena et al. | |
| 11,126,230 B1 * | 9/2021 | Chen | G06F 1/181 |
| 11,231,093 B2 * | 1/2022 | Di | G06F 13/4068 |
| 11,747,872 B1 | 9/2023 | Rathinasamy et al. | |
| 12,096,589 B2 * | 9/2024 | Lin | H05K 7/1401 |
| 2007/0030647 A1 * | 2/2007 | Chen | B60R 11/0235 |
| | | | 312/196 |
| 2023/0103941 A1 | 4/2023 | Tsorng et al. | |

OTHER PUBLICATIONS

Netapp Inc., "Replace PCIe Card—ASA A800," Aug. 16, 2023, https://docs.netapp.com/us-en/ontap-systems/asa800/pci-cards-and-risers-replace.html#step-1-shut-down-the-impaired-controller, 12 pages.

* cited by examiner

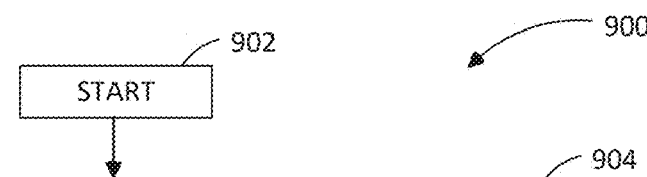

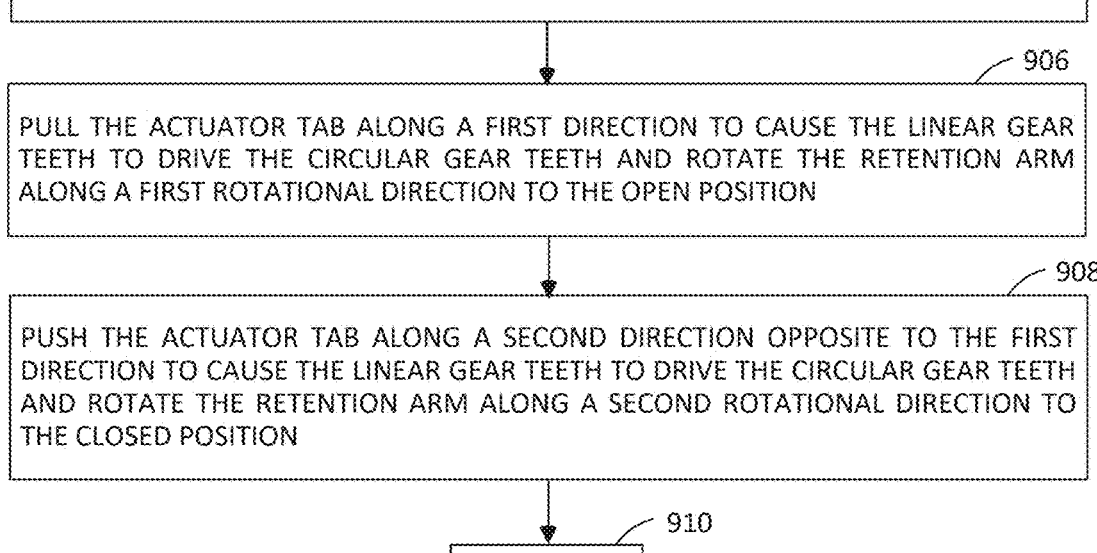

902

900

904

START

SLIDE AN ACTUATOR TAB OF AN ELECTRONIC MODULE RETENTION ASSEMBLY ALONG A VERTICAL SUPPORT PANEL OF AN INFORMATION PROCESSING DEVICE AND CAUSING A RETENTION ARM OF THE ELECTRONIC MODULE RETENTION ASSEMBLY, MOVABLY COUPLED THE ACTUATOR TAB TO ROTATE BETWEEN AN OPEN POSITION AND A CLOSED POSITION

WHERE THE ACTUATOR TAB INCLUDES LINEAR GEAR TEETH MOVABLY COUPLED TO THE VERTICAL SUPPORT PANEL, WHEREIN THE RETENTION ARM EXTENDS FROM A FIRST END PORTION TO A SECOND END PORTION ALONG A FIRST DIMENSION, THE FIRST END PORTION INCLUDES CIRCULAR GEAR TEETH AND THE SECOND END PORTION INCLUDES AN ATTACHMENT ELEMENT CONFIGURED TO RELEASABLY COUPLE TO AN ELECTRONIC MODULE, THE RETENTION ARM BEING PIVOTABLY COUPLED TO THE VERTICAL SUPPORT PANEL AND MOUNTED ON A FACE OF THE ACTUATOR TAB SUCH THAT THE CIRCULAR GEAR TEETH AND THE LINEAR GEAR TEETH ARE ENGAGED WITH EACH OTHER TO MOVABLY COUPLE THE RETENTION ARM TO THE ACTUATOR TAB,

WHERE, IN THE OPEN POSITION, THE RETENTION ARM IS ORIENTED SUCH THAT THE FIRST DIMENSION OF THE RETENTION ARM IS PERPENDICULAR TO THE VERTICAL SUPPORT PANEL AND THE ATTACHMENT ELEMENT IS ENGAGED WITH THE ELECTRONIC MODULE AND SECURE THE ELECTRONIC MODULE TO THE INFORMATION PROCESSING DEVICE, AND

WHERE, IN THE CLOSED POSITION, THE RETENTION ARM IS ORIENTED SUCH THAT THE FIRST DIMENSION OF THE RETENTION ARM IS PARALLEL TO THE VERTICAL SUPPORT PANEL AND THE ATTACHMENT ELEMENT IS DISENGAGED FROM THE ELECTRONIC MODULE AND RELEASE THE ELECTRONIC MODULE FROM THE INFORMATION PROCESSING DEVICE

906

PULL THE ACTUATOR TAB ALONG A FIRST DIRECTION TO CAUSE THE LINEAR GEAR TEETH TO DRIVE THE CIRCULAR GEAR TEETH AND ROTATE THE RETENTION ARM ALONG A FIRST ROTATIONAL DIRECTION TO THE OPEN POSITION

908

PUSH THE ACTUATOR TAB ALONG A SECOND DIRECTION OPPOSITE TO THE FIRST DIRECTION TO CAUSE THE LINEAR GEAR TEETH TO DRIVE THE CIRCULAR GEAR TEETH AND ROTATE THE RETENTION ARM ALONG A SECOND ROTATIONAL DIRECTION TO THE CLOSED POSITION

910

END

FIG. 9

ELECTRONIC MODULE RETENTION ASSEMBLY TO RELEASABLY SECURE AN ELECTRONIC MODULE TO AN INFORMATION PROCESSING DEVICE

BACKGROUND

An information processing device such as a computer, a networking device, or the like may include a primary system board (e.g., a motherboard) having hardware components such as central processor units, resistors, capacitors, or the like to provide some basic function. In order to pursue stronger performance and/or expand functionality of the device, an electronic module such as an expansion card (e.g., display card) may be coupled to the primary system board. In some information processing devices, the primary system board may include a connector (e.g., expansion slot) that can directly receive the expansion card. However, in other information processing devices, the primary system board may lack the appropriate number or type of connectors needed to receive desired expansion card(s), or the connectors may be present but in an inconvenient location, and thus in some information processing devices, another electronic module (or an intermediary electronic module) which carries a connector that is suitable for the expansion card may be coupled to the primary system board, thus providing the needed connection point for the expansion card. Such an intermediary electronic module is generally referred to as a riser card.

BRIEF DESCRIPTION OF THE DRAWINGS

Various examples will be described below with reference to the following figures.

FIG. 9 is a flowchart depicting a method of releasably securing an electronic module to an information processing device using an electronic module retention assembly according to an example implementation of the present disclosure.

DETAILED DESCRIPTION

Figures 1A, 1B:
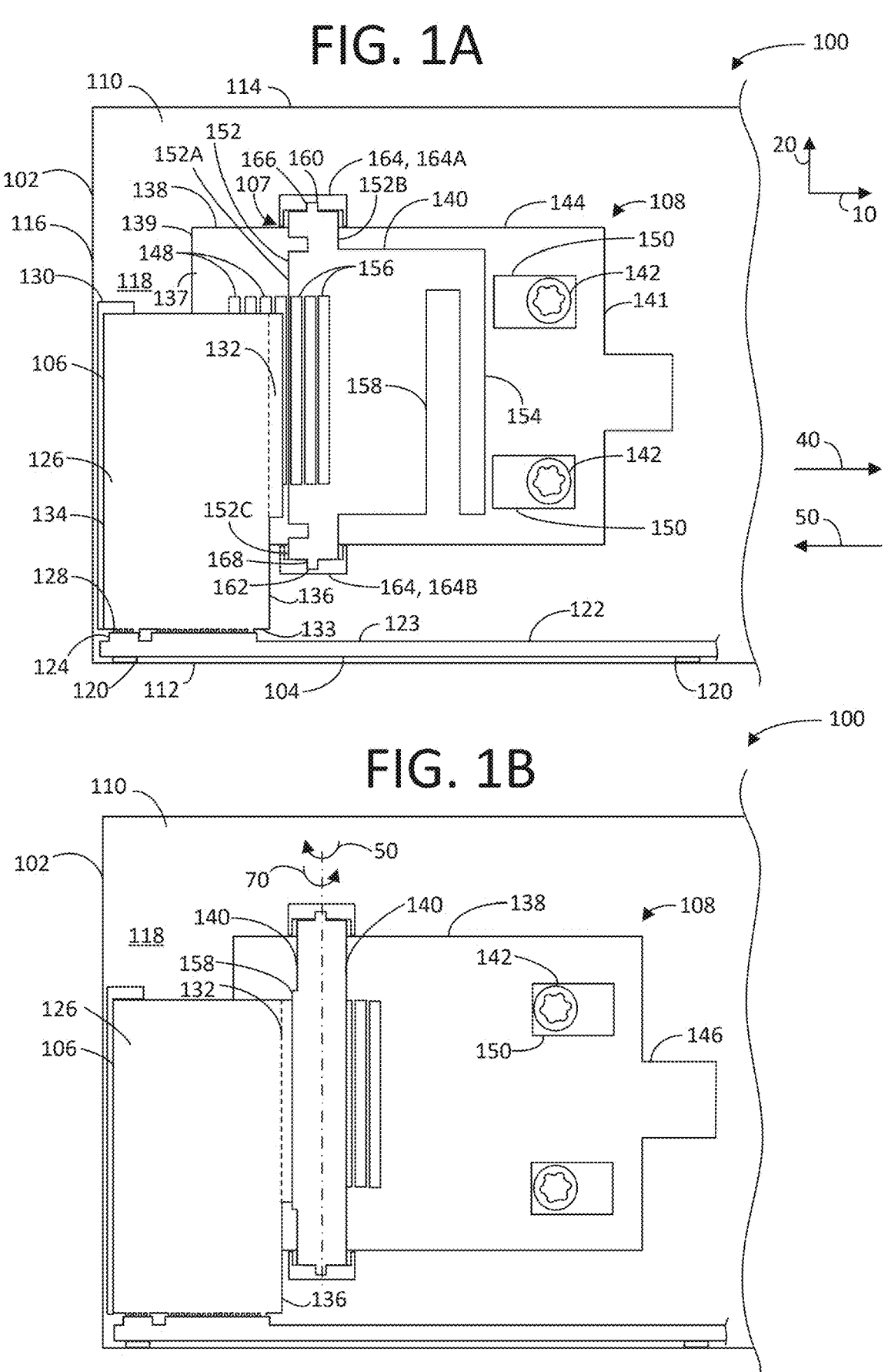
FIG. 1A illustrates a side view of a portion of an information processing device having a chassis, a primary system board, an electronic module, and an electronic module retention assembly in a stowed position according to an example implementation of the present disclosure.
FIG. 1B illustrates a side view of a portion of the information processing device of FIG. 1A having the electronic module retention assembly transitioned from the stowed position to a deployed position according to the example implementation of the present disclosure.

The following detailed description refers to the accompanying drawings. For purposes of explanation, certain examples are described with reference to the components illustrated in FIGS. 1-9. The functionality of the illustrated components may overlap, however, and may be present in a fewer or greater number of elements and components. Moreover, the disclosed examples may be implemented in various environments and are not limited to the illustrated examples. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

An electronic module such as an expansion card or a riser card may include a circuit board, an electrical connector (e.g., an edge connector), and a bracket. The electrical connector may be positioned at the bottom edge of the circuit board and the bracket may be coupled to one of the peripheral sides of the circuit board. Further, the circuit board may be configured to be coupled to a primary system board of an information processing device by removably connecting the electrical connector to a connector (e.g., an expansion slot) of the primary system board. Further, the bracket may be configured to be detachably coupled to one of a font panel or a rear panel of a chassis to secure the electronic module to the information processing device. Since the electronic module is only coupled at one of its peripheral sides to the chassis, an opposite peripheral side of the electronic module may be relatively free to move, thus during certain circumstances, the electronic module may at least partially get dislodged (e.g., pop out) from the expansion slot. For instance, when the information processing device is subjected to vibrations (e.g., either during transportation or service events), or shocks, the edge connector may get dislodged from the expansion slot. Additionally, the edge connector and/or the expansion slot may get damaged due to such abrupt movement of the electronic module and dislodging of the edge connector from the expansion slot.

One approach to addressing the aforementioned issues is to provide a clamp which has a first end portion coupled to the chassis and a second end portion extending from the first end portion into the interior volume of the chassis to engage with the opposite peripheral side of the electronic module, and thereby restrict the movement of the electronic module. Thus, the clamp may further assist in securing the electronic module to the information processing device and prevent the electronic module from being partially dislodged from the primary system board. However, in this approach, the clamp is immovably oriented to extend into the internal volume of the chassis, and therefore it may obstruct the insertion/removal of the electronic module, the primary system board, and/or other components into or out of the chassis. Therefore, whenever there is a need to add or remove a component in the vicinity of the clamp, such as during manufacture, upgrade, maintenance, or repair events, the clamp may have to be removed from the chassis in order to clear a path to the internal volume of the chassis for the component to be installed in or removed from the chassis, and then subsequently the clamp may need to be reattached. The need to remove and reattach the clamp from the chassis can be cumbersome for the user and make the service or other procedure take longer to complete. Furthermore, because the clamp is detached and set aside during the procedure, there is a risk that the clamp is misplaced. Additionally, the removal and installation of the clamp from the chassis during such events may require the use of tools (e.g., to remove fasteners), which further complicates the procedure and may limit the circumstances under which the procedure may be performed (e.g., users may need to have ready access to tools.)

A technical solution to the aforementioned problems may include providing an electronic module retention assembly that may be coupled to a vertical support panel of a chassis of an information processing device and which has a retention arm which can be rotated relative to the chassis between two positions. In one position (e.g., a "deployed position"), the retention arm protrudes into an internal volume of the chassis such that a distal end portion of the retention arm can engage with an electronic module and secure the electronic module to the chassis. In the other position (e.g., a "stowed position"), the distal end portion of the retention arm is positioned adjacent to the vertical support panel and protrudes a shorter distance into the internal volume, thus clearing a path to allow unobstructed (or less obstructed) access to the installation location of one or more components of the information processing device, such as the electronic module, a primary system board, or other component. More specifically, in the deployed position, the retention arm extends transverse to (in some examples, substantially perpendicular to) the face of the vertical support panel, whereas in the stowed position the retention arm extends at a more acute angle relative to (in some examples, substantially parallel to) the face of the vertical support panel. Moreover, in some examples, in the deployed position the retention arm extends partially over a primary system board of the information processing device, and, in some examples, in the stowed position the retention arm does not extend over the primary system board. The ability to move the retention arm to the stowed position can facilitate easier installation or removal of a component because the retention arm in the stowed position does not obstruct (or obstruct less) access to the installation location. Moreover, the rotation of the retention arm between the deployed and stowed positions does not require the detachment of the electronic module retention assembly from the chassis, and thus the difficulties described above related to needing to detach/reattach a clamp can be avoided.

In addition, in some examples, the electronic module retention assembly may be a tool-less retention assembly, meaning that actuation of the retention arm between the deployed and stowed positions can be achieved without tools. For example, the electronic module retention assembly may include a slidable actuator tab which is engaged with the rotatable retention arm such that manual sliding of the actuator tab drives rotation of the retention arm. In such examples, the actuator tab may have linear gear teeth and may be movably coupled to the vertical support panel and configured to slide along the vertical support panel. Furthermore, in these examples, the retention arm extends from a first end portion to a second end portion along a first dimension of the retention arm and has circular gear teeth at the first end portion and an attachment element at the second end portion. The first end portion of the retention arm may be pivotably coupled to the vertical support panel and mounted on a face of the actuator tab such that the circular gear teeth and the linear gear teeth are engaged with each other. In such examples, a sliding movement of the actuator tab is converted by the engagement between the linear and circular gears into a rotation movement of the retention arm (pivoting about an axis at the first end portion) between the stowed position and the deployed position.

In some examples, the actuator tab may be pulled to slide along a first direction and cause the linear gear teeth to drive the circular gear teeth and rotate the retention arm along a first rotational direction to the deployed position. More particularly, the retention arm in the deployed position may be positioned to protrude into the internal volume of the chassis such that the attachment element is positioned adjacent to the electronic module and engage with the electronic module. In other words, in the deployed position, the retention arm may be oriented such that the first dimension of the retention arm is perpendicular to the vertical support panel and the attachment element is positioned to engage with the electronic module and thereby retain the electronic module to the information processing device.

Further, the actuator arm may be pushed to slide along a second direction opposite to the first direction and cause the linear gear teeth to drive the circular gear teeth and rotate the retention arm along a second rotational direction opposite the first rotational direction to the stowed position. More particularly, the retention arm in the stowed position may be positioned with the second end portion thereof adjacent to the vertical support panel and may not obstruct the installation of the electronic module, the primary system board, and/or other components into or out of the chassis. In other words, in the stowed position, the retention arm is oriented such that the first dimension of the retention arm is parallel to the vertical support panel and the attachment element is positioned to be disengaged from the electronic module and thereby release the electronic module from the information processing device.

In some examples, the electronic module retention assembly may include additional components which engage with the aforementioned actuator tab and retention arm to mount them to the vertical support and/or otherwise facilitate their operation. Some of these components may be part of the vertical support. In particular, in some examples, pivot tabs may be formed from portions of the vertical support which have been bent to protrude into the internal volume, and these may engage with the retention arm to pivotably couple it to the vertical support. Furthermore, in some examples, the vertical support may include apertures positioned to engage with protrusions of the actuator tab to secure the actuator tab in predetermined positions, such as a position associated with a deployed state of the retention arm and a position associated with a stowed state of the retention arm.

In some examples, the vertical support panel may be a sidewall of the chassis, a sidewall of a drive cage, a side wall of a power supply unit (PSU) cage, or an internal divider wall of the chassis. Further, the attachment element may be a groove that is configured to engage with a circuit board or an extension bracket of the electronic module in the deployed position of the retention arm and secure the electronic module to the information processing device. In some examples, the electronic module may be an expansion card (e.g., a graphics processing unit (GPU) card) or a riser card (e.g., an intermediary card.) In some examples, each of the expansion card and the riser card is a peripheral component interconnect express (PCI-e) card.

Accordingly, the electronic module retention assembly of the present disclosure may include components such as the actuator tab that is slidable relative to the vertical support panel, and the retention arm that is rotatable relative to the actuator tab, thereby allowing the retention arm to be oriented perpendicularly from the vertical support frame to secure the electronic module, or to be oriented parallel and position adjacent to the vertical support frame to allow insertion/removal of the electronic module, the primary system board, and/or other components into or out of the chassis. In contrast, in alternative approaches, the clamp may include an immovable element, which may remain stationary in the internal volume, thereby obstructing insertion/removal of the electronic module, the primary system module, and/or other components into or out of the chassis. The electronic module retention assembly utilizes a linear motion to a rotary motion conversion technique for transitioning between the stowed position and the deployed position, thus, the electronic module retention assembly may be manufactured using simple mechanical components such as a slidable actuation tab and a rotatable retention arm. Further, the moving mechanical components (actuation tab and retention arm) may be produced using simple manufacturing techniques such as a injection molding, additive manufacturing (3D printing), or the like. Moreover, the portions of retention assembly which are part of the vertical supports may, in some examples, be manufactured using simple and cost effective manufacturing techniques like sheet-metal stamping. Additionally, the electronic module retention assembly may be manufactured using thermoplastic materials or polymer materials, which may be cost-effective. Further, the electronic module retention assembly may be easily assembled by engaging the actuator tab and the retention arm with each other, and with the vertical support panel, thus the electronic module retention assembly may be easily deployed anywhere in the chassis. Additionally, the retention arm may be moved to the stowed position when not in use, thus, the electronic module retention assembly occupies less space and can be deployed in areas with less space in the chassis. Further, the electronic module retention assembly does not have to be removed from the chassis to allow insertion/removal of the electronic module from the chassis, thereby making the installation/removal process faster and easier and providing users the flexibility of not needing tools (in contrast to the clamp described above.)

Turning to the Figures, FIG. 1A depicts a side view of an information processing device 100 having a chassis 102, a primary system board 104, an electronic module 106, and an electronic module retention assembly 108 in a stowed position. FIG. 1B depicts a side view of the information processing device 100 of FIG. 1A having the electronic module retention assembly 108 transitioned from the stowed position to a deployed position. In the description hereinafter, FIGS. 1A-1B are described concurrently for ease of illustration. It should be understood that the Figures, FIGS. 1A-1B are not intended to illustrate specific shapes, dimensions, or other structural details accurately or to scale and that implementations of the information processing device 100 may have different numbers and arrangements of the illustrated components and may also include other parts that are not illustrated. In some examples, the information processing device 100 may be a computer (e.g., a server, a storage device), a networking device (e.g., a switch, an access point), or the like. As mentioned herein, in some examples, the information processing device 100 includes the chassis 102, the primary system board 104, the electronic module 106, and the electronic module retention assembly 108.

The chassis 102 may include an enclosure formed by a pair of sidewalls, a base 112, a cover 114, a rear panel 116, and a front panel (not shown.) In some examples, the pair of sidewalls are connected to the base 112, the cover 114, the rear panel 116, and the front panel to define an internal volume 118 therebetween. In particular, each sidewall is disposed perpendicular to and coupled to the base 112. In addition to the enclosure described above, the chassis 102 may also include additional internal support structures which are mounted to the enclosure and provide additional structural support and rigidity, such as drive cages, power supply unit (PSU) cages, internal brackets, etc. The chassis 102 also includes a vertical support panel 110. In some examples, the vertical support panel 110 is one of the sidewalls of the chassis 102. However, in some other examples, the vertical support panel 110 may be a sidewall of a drive cage, a sidewall of the PSU cage, an internal divider wall, or some other part of the chassis 102.

The primary system board 104 is positioned within the internal volume 118 and mounted on the base 112 via a plurality of support members 120. In some examples, the primary system board 104 is a host processor module including a plurality of electronic components as per open compute program (OCP) guidelines. In some other examples, the primary system board 104 is a motherboard. The primary system board 104 includes a substrate 122 and the plurality of electronic components (not shown), such as a central processing unit, resistors, capacitors, data ports, and power ports, or the like mounted on the substrate 122. The primary system board 104 further includes a first electrical connector 124 mounted on a top edge 123 of the substrate 122. In particular, the first electrical connector 124 may be positioned adjacent to the vertical support panel 110 of the chassis 102. In some examples, the first electrical connector 124 may be a modular extensible input output (M-XIO) socket, a peripheral component interconnect express (PCI-e) expansion slot, or the like.

The electronic module 106 may be an expansion card (e.g., a graphics processing unit (GPU) card), a riser card (e.g., an intermediary card), or the like. The electronic module 106 includes a circuit board 126 and a second electrical connector 128. In some examples, the electronic module 106 also includes a bracket 130. In some examples, the electronic module 106 also includes an extension element 132. In some examples, the extension element 132 may be an extension bracket. In some other examples, the extension element 132 may be an extended portion of the circuit board 126. In one or more examples, the second electrical connector 128 is positioned at a bottom edge 133 of the circuit board 126, the bracket 130 is positioned at a first peripheral side 134 of the circuit board 126, and the extension element 132 is positioned at a second peripheral side 136 opposite to the first peripheral side 134 of the circuit board 126. In one or more examples, the second electrical connector 128 may a PCI-e edge connector having a profile complementary to the profile of the PCI-e expansion slot of the primary system board 104 or a M-IXO connector having a profile complementary to the profile of the M-IXO socket of the primary system board 104. In some examples, the electronic module 106 is vertically oriented and mounted on the primary system board 104 such that the second electrical connector 128 is detachably connected to the first electrical connector 124 and the circuit board 126 of the electronic module 106 is parallel to the vertical support panel 110. In some examples, after the electronic module 106 is detachably connected to the first electrical connector 124, the bracket 130 of the electronic module 106 is coupled to the chassis 102 to secure the first peripheral side 134 of the electronic module 106 to the chassis 102; for example, the bracket 130 may be coupled to the rear panel 116 in some examples, to the front panel in some other examples, or to some other portion of the chassis 102 in some other examples.

The electronic module retention assembly 108 may be a holder assembly, which is configured to releasably secure the electronic module 106 to the information processing device 100. In particular, the electronic module retention assembly 108 may be configured to secure the second peripheral side 136 of the electronic module 106 to the information processing device 100. In some examples, the electronic module retention assembly 108 includes a movable portion 107 including an actuator tab 138 and a retention arm 140. The electronic module retention assembly 108 also includes stationary portion 109 including a set of fasteners 142, pivot tabs 164, and (in some examples) other engagement features of the vertical support panel 110 which engage the movable portion 107 to mount the movable portion 107 to the vertical support panel 110 and/or otherwise constrain motions of the movable portion 107.

The actuator tab 138 may be a driver component of the electronic module retention assembly 108, which is configured to drive the retention arm 140 between the stowed position and the deployed position. In some examples, the actuator tab 138 includes a body section 144 and a handle section 146 extending from the body section 144. The body section 144 includes linear gear teeth 148 disposed adjacent to a first peripheral end portion 139 of the body section 144, and a set of slots 150 disposed adjacent to a second peripheral end portion 141 opposite to the first peripheral end portion 139 of the body section 144. In such examples, the handle section 146 is connected to the second peripheral end portion 141 of the body section 144.

The retention arm 140 may be a holder component of the electronic module retention assembly 108, which may be configured to releasably engage with the electronic module 106 (e.g., the second peripheral side 136 of the electronic module 106) to secure or release the electronic module 106 from the information processing device 100. The retention arm 140 extends from a first end portion 152 to a second end portion 154 along a first dimension (e.g., a length dimension) of the retention arm 140 (which is parallel to axis 10 in the state shown in FIG. 1A.) The first end portion 152 includes circular gear teeth 156 and the second end portion 154 includes an attachment element 158.

The set of fasteners 142 may be coupling component, which may be configured to movably couple the actuator tab 138 to the vertical support panel 110. In some examples, each fastener of the set of fasteners 142 is a step screw.

Referring to the actuator tab 138, each slot of the set of slots 150 of the actuator tab 138 elongates along a first dimension (e.g., the length dimension) of the actuator tab 138 (which is parallel to axis 10 in FIG. 1A) and the set of slots 150 are spaced apart from each other along a second dimension (e.g., a height dimension) of the actuator tab 138 (which is parallel to axis 20 in the state shown in FIG. 1A and perpendicular to the first dimension of the actuator tab 138.) Each tooth of the linear gear teeth 148 extends along the second dimension of the actuator tab 138 and protrudes from a face 137 of the actuator tab 138 along a third dimension (e.g., a width dimension) of the actuator tab 138 (which is perpendicular to both the first and second dimensions) (e.g., extending perpendicular to the page in FIG. 1A.) Moreover, the linear gear teeth 148 are distributed at spaced apart intervals along the first dimension of the of the actuator tab 138 (parallel to axis 10.) Now referring to the retention arm 140, the first end portion 152 of the retention arm 140 has a rounded (e.g., semi-circular) profile and includes the circular gear teeth 156 at a center 152A of the first end portion 152, a first pivot pin 160 at a top end 152B of the first end portion 152, and a second pivot pin 162 at a bottom end 152C of the first end portion 152. It may be noted herein that the first pivot pin 160 and the second pivot pin 162 are collectively referred to as a set of pivot pins. The second end portion 154 of the retention arm 140 includes the attachment element 158 such as a groove extending along a second dimension (e.g., the height dimension) of the retention arm 140 (which is parallel to the axis 20 in FIG. 1A.) Now referring to the chassis 102, the vertical support panel 110 includes a set of pivot tabs 164, e.g., a first pivot tab 164A and a second pivot tab 164B, which are spaced apart from each other vertically (i.e., parallel to axis 20 in FIG. 1A.) In some examples, each pivot tab 164 has a pivot hole, e.g., the first pivot tab 164A has a first pivot hole 166 and the second pivot tab has a second pivot hole 168. The vertical support panel 110 also includes a fastening element (not visible) complementary to the fasteners 142 and configured to engage with the fasteners 142. In some examples, the fastener 142 includes a protruding portion (e.g., the fastener 142 is a screw, bolt, etc.) and the fastening element may include an aperture to receive the fastener 142. In other examples, the fastening element may include a protruding portion to be received by the fastener 142 (e.g., the fastener 142 is a nut and the fastening element is a screw.)

To assemble the electronic module retention assembly 108 to the information processing device 100, the actuator tab 138 is movably coupled to the vertical support panel 110. In particular, the body section 144 of the actuator tab 138 is configured to be disposed between pivot tabs 164 to constrain the actuator tab 138 to slide only parallel to axis 10. Further, the set of fasteners 142 is inserted through the set of slots 150 of the body section 144 to movably couple the actuator tab 138 to the vertical support panel 110. In such examples, the set of slots 150 may constrain the sliding movement of the actuator tab 138 to only up to a width of the set of slots 150. In such examples, the handle section 146 of the actuator tab 138 may be pushed or pulled to cause the body section 144 of the actuator tab 138 to slide along the vertical support panel 110. In addition, the retention arm 140 is pivotably coupled to the vertical support panel 110 and rotatably coupled to the actuator tab 138. For example, the set of pivot pins engages with corresponding pivot tabs of the vertical support panel 110 to pivotably couple the retention arm 140 to the vertical support panel 110. In particular, the first pivot pin 160 of the actuator tab 138 is engaged with the first pivot hole 166 of the vertical support panel 110, and the second pivot pin 162 of the retention arm 140 is engaged with the second pivot hole 168 of the vertical support panel 110 to pivotably couple the retention arm 140 to the vertical support panel 110. Thus, pivot axis parallel to axis 20 extends between the first and second pivot holes 166 and 168, with the retention arm 140 being pivotable about the pivot axis. Further, the retention arm 140 is mounted on the face 137 of the actuator tab 138 such that the circular gear teeth 156 and the linear gear teeth 148 are engaged with each other, and thereby rotatably coupling the retention arm 140 to the actuator tab 138. In such examples, a sliding movement of the actuator tab 138 relative to the vertical support panel 110 (parallel to axis 10) may cause rotation of the retention arm 140 about the pivot axis between the deployed position and the stowed position.

In the example of FIG. 1A, the electronic module retention assembly 108 is in the stowed position. In other words, in the stowed position, the retention arm 140 is oriented such that the first dimension of the retention arm 140 is at an acute angle (in some examples, parallel to) the vertical support panel 110 and the attachment element 158 is positioned to be disengaged from the electronic module 106 and release the electronic module 106 from the information processing device. In particular, in the stowed position, the attachment element 158 is disengaged from the extension element 132 of the circuit board 126 and positioned parallel to the vertical support panel 110 of the chassis 102, and thereby allowing the electronic module 106 and/or the primary system board 104 to be inserted/removed from the chassis 102. More particularly, in the stowed position, the electronic module retention assembly 108 may be moved away from the internal volume 118 of the chassis 102 in order to clear a path to the internal volume 118 of the chassis 102 and thereby allowing installation of the electronic module 106 and/or the primary system board 104 in the chassis 102.

Further, the handle section 146 of the actuator tab 138 may be pulled along a first direction 40 to slide along the vertical support panel 110 and cause the retention arm 140 to rotate along a first rotational direction 50 and thereby transitioning the electronic module retention assembly 108 from the stowed position to the deployed position, as shown in FIG. 1B. (In FIG. 1B, the first rotational direction 50 is shown as a clockwise direction as an example, but in other examples the first rotational direction 50 could be an anti-clockwise direction.) When the handle section 146 is pulled along the first direction 40, the linear gear teeth 148 of the actuator tab 138 drives the circular gear teeth 156 of the retention arm 140 and rotates the retention arm 140 along the first rotational direction 50 from the stowed position to the deployed position. In such examples, the slots 150 guide and constrain sliding movement of the actuator tab 138 relative to the vertical support panel. In particular, the slots 150 guide and constrain the actuator tab 138 to slide along the first direction 40 only up to the width of the set of slots 150. In some examples, in the deployed position, the retention arm 140 is oriented such that the first dimension of the retention arm 140 is transverse to (in some examples, substantially perpendicular to) a face of the vertical support panel 110 and the attachment element 158 is positioned to engage with the electronic module 106 and secure the electronic module 106 to the information processing device 100. Transverse, as used herein, refers to an object being oriented at a non-zero angle relative to another object, and may include but is not limited to a perpendicular orientation. In particular, in the deployed position, the attachment element 158 is engaged to the extension element 132 of the electronic module 106, thereby further securing the second peripheral side 136 of the electronic module 106 to the chassis 102. More particularly, in the deployed position, the retention arm 140 is rotated to extend into the internal volume 118 of the chassis 102 in order to engage with the electronic module 106 and secure the electronic module 106 to the chassis 102.

Further, the handle section 146 of the actuator tab 138 may be pushed along a second direction 60 opposite to the first direction 40, to slide the actuator tab 138 along the vertical support panel 110 and cause the retention arm 140 to rotate along a second rotational direction 70 (opposite the first rotational direction 50) and thereby transitioning the electronic module retention assembly 108 from the deployed position to the stowed position, as shown in FIG. 1A (In FIG. 1B, the second rotational direction 70 is shown as an anti-clockwise direction as an example, but in other examples the second rotational direction 70 could be a clockwise direction.) When the handle section 146 is pushed along the second direction 60, the linear gear teeth 148 of the actuator tab 138 drives the circular gear teeth 156 of the retention arm 140 and rotates the retention arm 140 along the second rotational direction 70 from the deployed position to the stowed position. In such examples, the set of slots 150 may guide and constrain the actuator tab 138 to slide along the second direction 60 only up to the width of the set of slots 150. As discussed herein, in the stowed position, the attachment element 158 is disengaged from the extension element 132 of the circuit board 126 and positioned parallel to the vertical support panel 110 of the chassis 102, and thereby allowing the electronic module 106 and/or the primary system board 104 to be inserted/removed from the chassis 102.

Figures 2A, 2B:
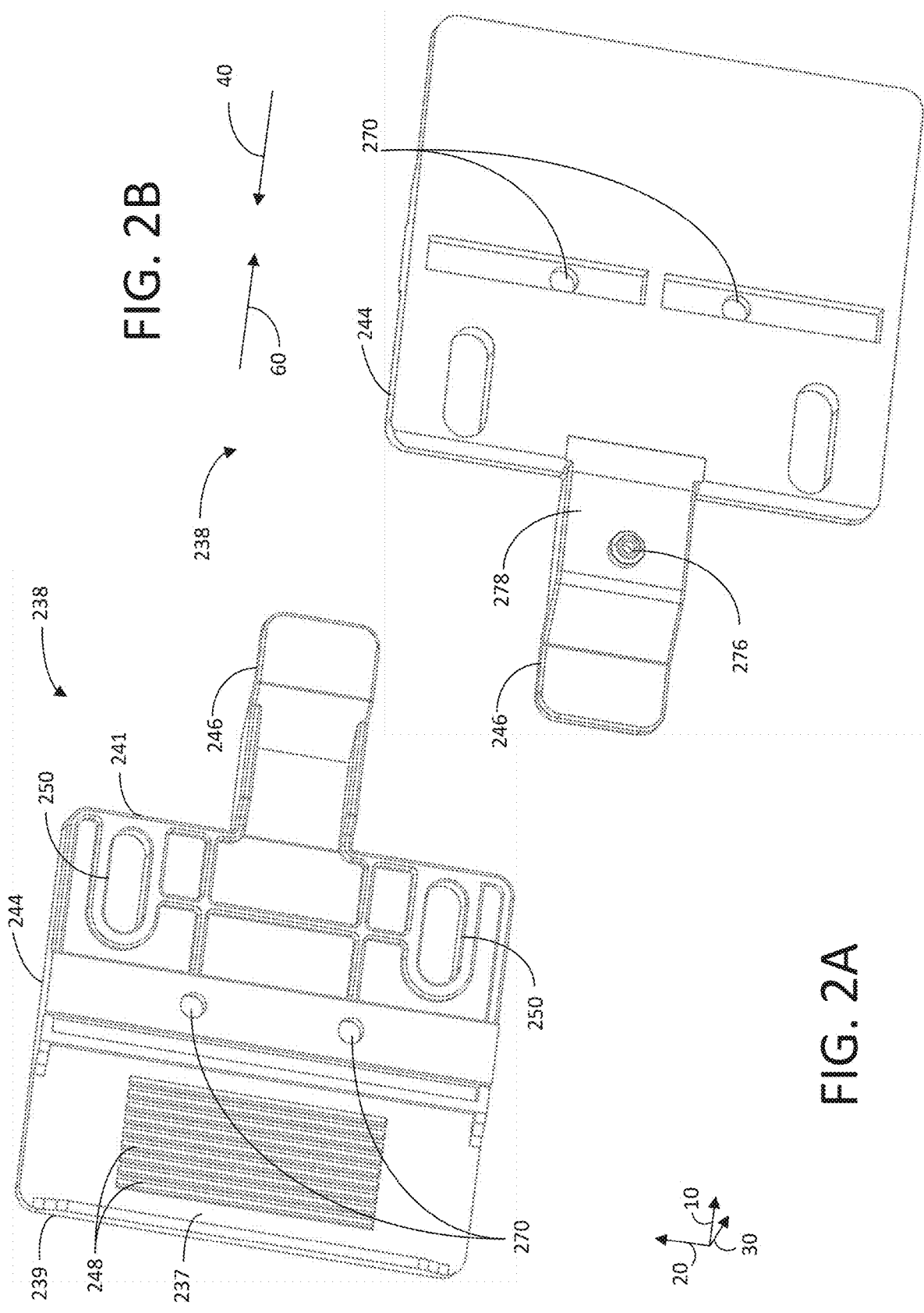
FIG. 2A illustrates a perspective side view of an actuator tab of an electronic module retention assembly according to the example implementation of the present disclosure.
FIG. 2B illustrates another perspective side view of the actuator tab of FIG. 2A according to the example implementation of the present disclosure.
Figure 4A:
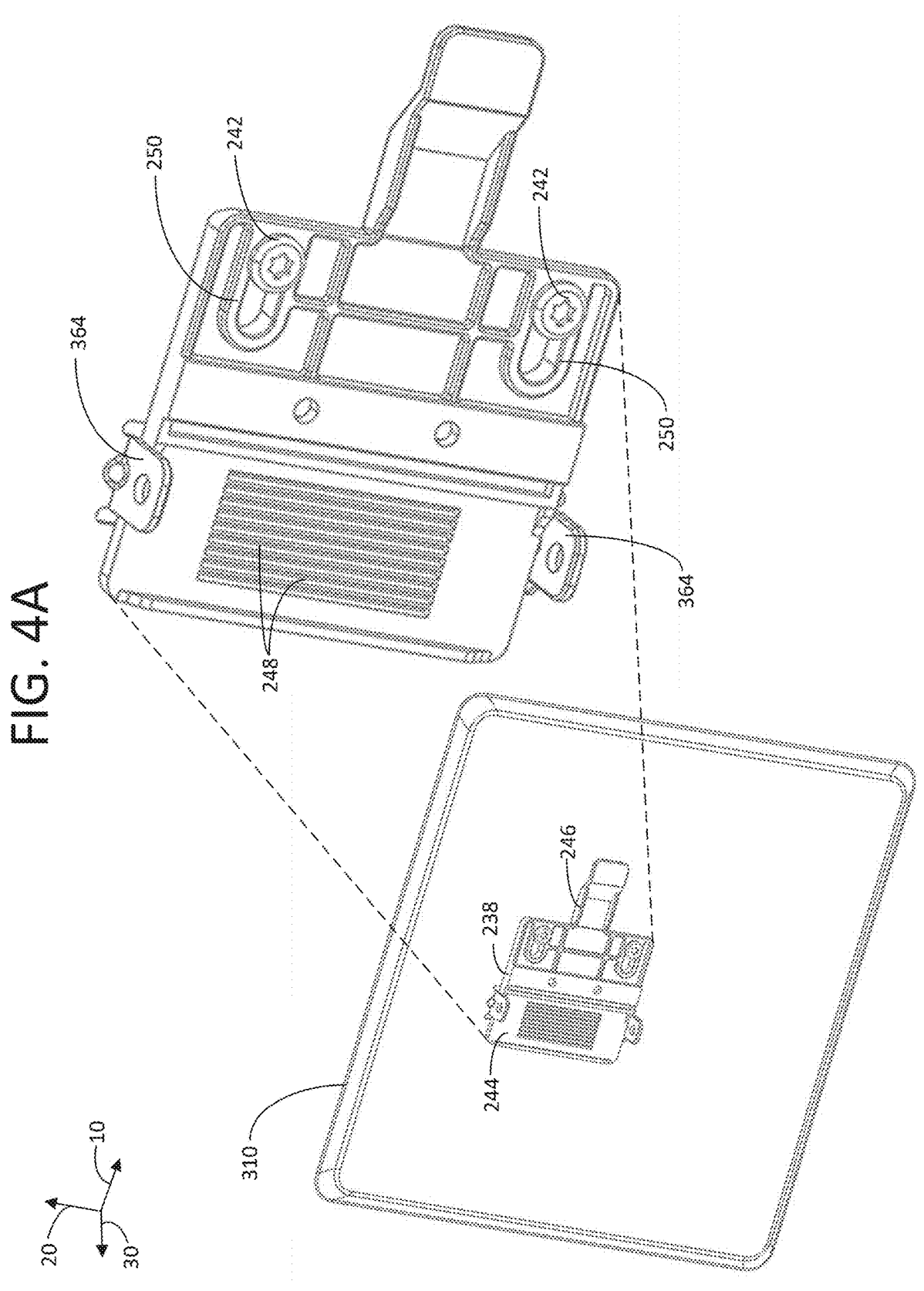
FIG. 4A illustrates a perspective side view of the actuator tab of FIGS. 2A-2B movably coupled to the vertical support panel of FIG. 3 according to an example implementation of the present disclosure.
Figure 4B:
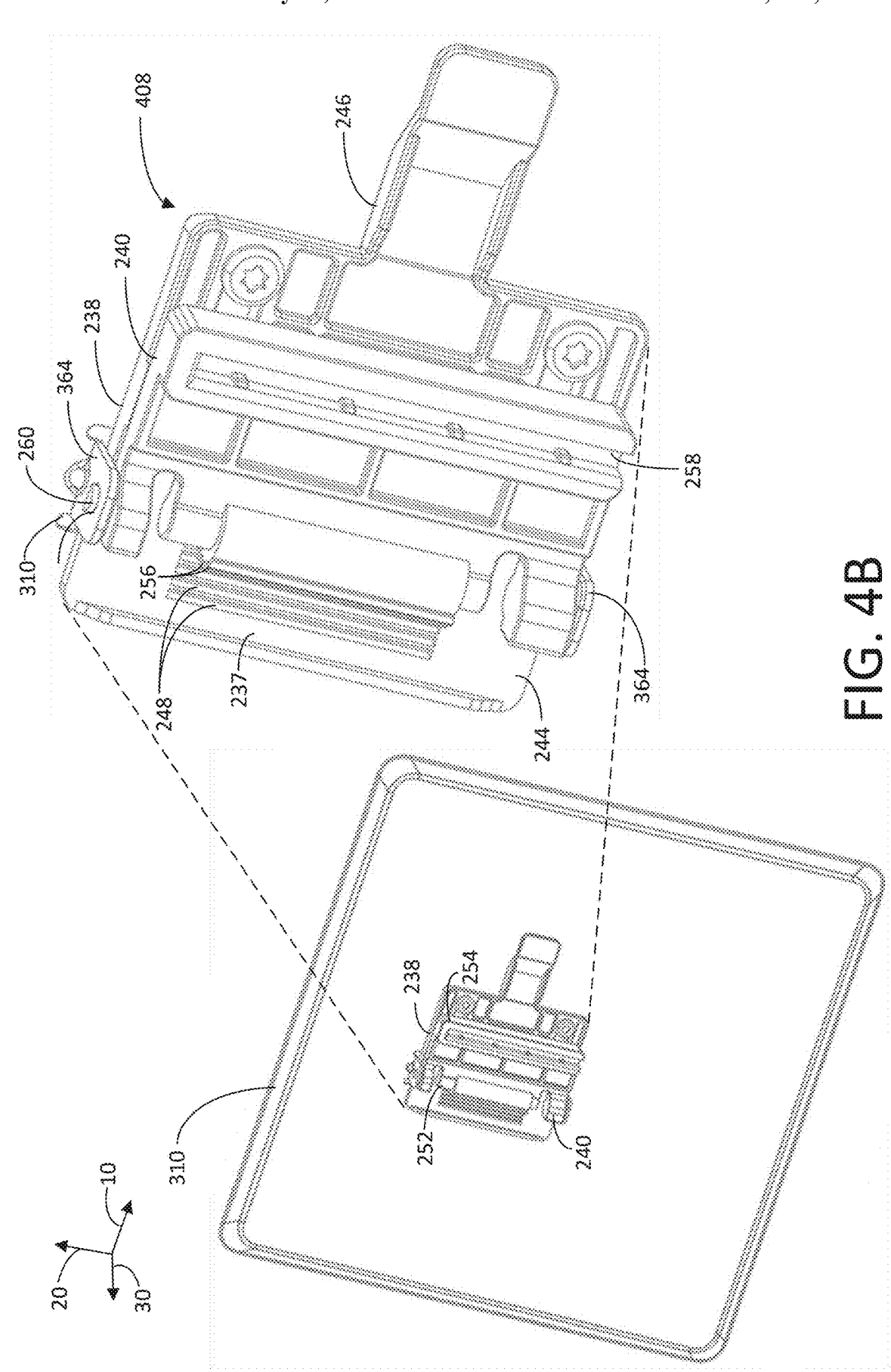
FIG. 4B illustrates a perspective side view of the retention tab of FIGS. 2C-2D pivotably coupled to the vertical support panel and mounted on a face of the actuator tab of FIG. 4A to define an example electronic module retention assembly according to an example implementation of the present disclosure.

FIG. 2A depicts a perspective side view of an actuator tab 238 of an electronic module retention assembly 408 (as shown in FIG. 4B.) FIG. 2B depicts another perspective side view of the actuator tab 238 of FIG. 2A. In the description hereinafter, FIGS. 2A-2B are described concurrently for ease of illustration. The electronic module retention assembly 408 is an example implementation of the electronic module retention assembly 108 described above, and the actuator tab 238 is an example implementation of the actuator tab 138 described above.

The actuator tab 238 includes a body section 244 and a handle section 246 extending from the body section 244. The body section 244 includes linear gear teeth 248 disposed adjacent to a first peripheral end portion 239 of the body section 244, and a set of slots 250 disposed adjacent to a second peripheral end portion 241 opposite to the first peripheral end portion 239 of the body section 244. In some examples, each slot of the set of slots 250 of the actuator tab 238 elongates along a first dimension (e.g., a length dimension) of the actuator tab 238 (which is parallel to axis 10 in a state shown in FIG. 2A) and the set of slots 250 are spaced apart from each other along a second dimension (e.g., a height dimension) of the actuator tab 238 (which is parallel to axis 20 in a state shown in FIG. 2A and perpendicular to the first dimension of the actuator tab 228.) Each tooth of the linear gear teeth 248 extends along the second dimension of the actuator tab 228 and protrudes from a face 237 of the actuator tab 238 along a third dimension (e.g., a width dimension) of the actuator tab 238 (which is perpendicular to both first and second dimensions) (e.g., which is parallel to axis 30 in a state shown in FIG. 2A.) The body section 244 further includes a set of openings 270 disposed between the linear gear teeth 248 and the set of slots 250 and spaced apart from each other along the second dimension. The handle section 246 is connected to the second peripheral end portion 241 of the body section 244. The handle section 246 includes a protrusion 276 that extends perpendicularly from a rear face 278 of the handle section 246.

Figures 2C, 2D, 2E:
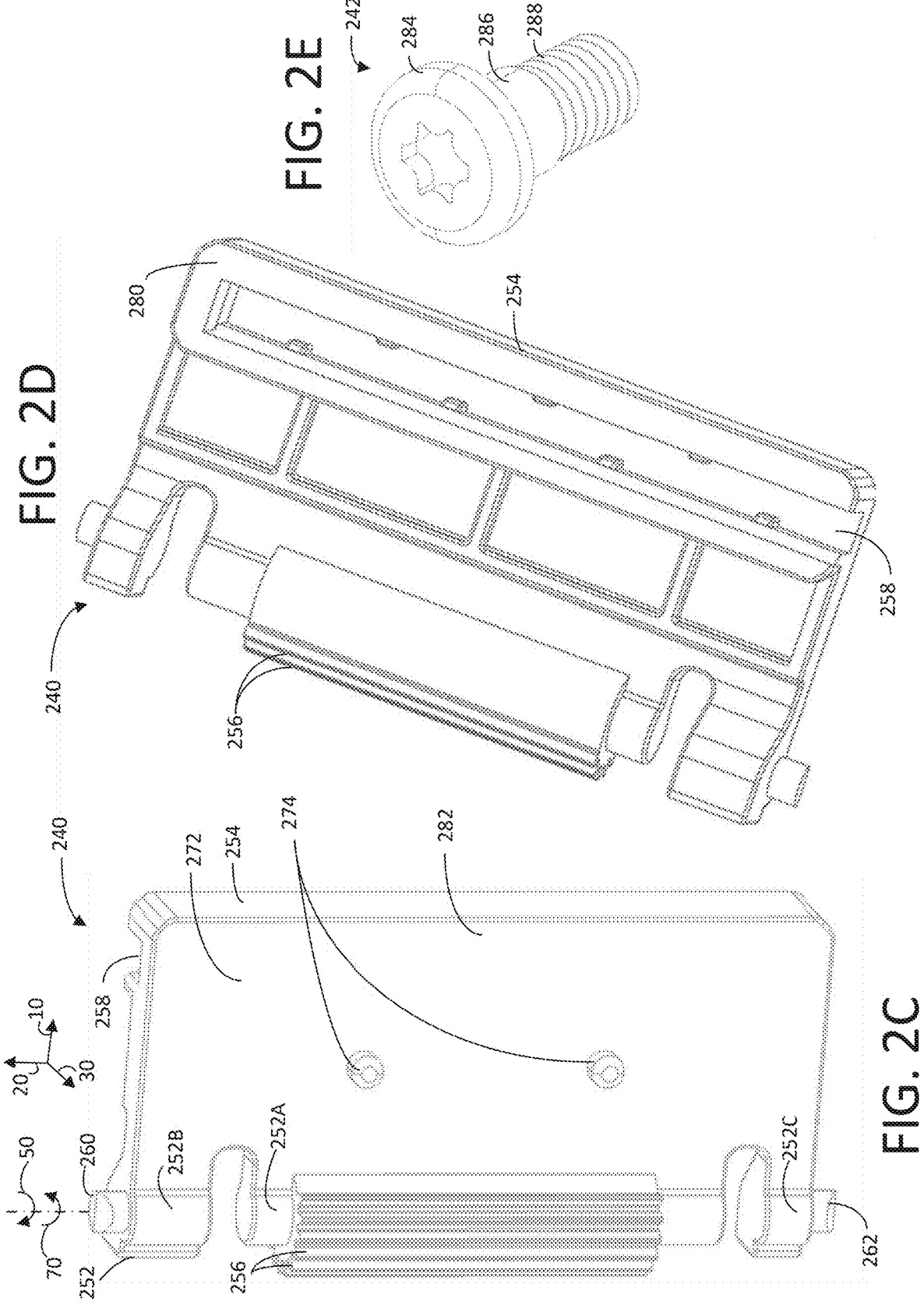
FIG. 2C illustrates a perspective side view of a retention arm of an electronic module retention assembly according to an example implementation of the present disclosure.
FIG. 2D illustrates another perspective side view of the retention arm of FIG. 2C according to an example implementation of the present disclosure.
FIG. 2E illustrates a perspective side view of a fastener of an electronic module retention assembly according to an example implementation of the present disclosure.
Figure 3:
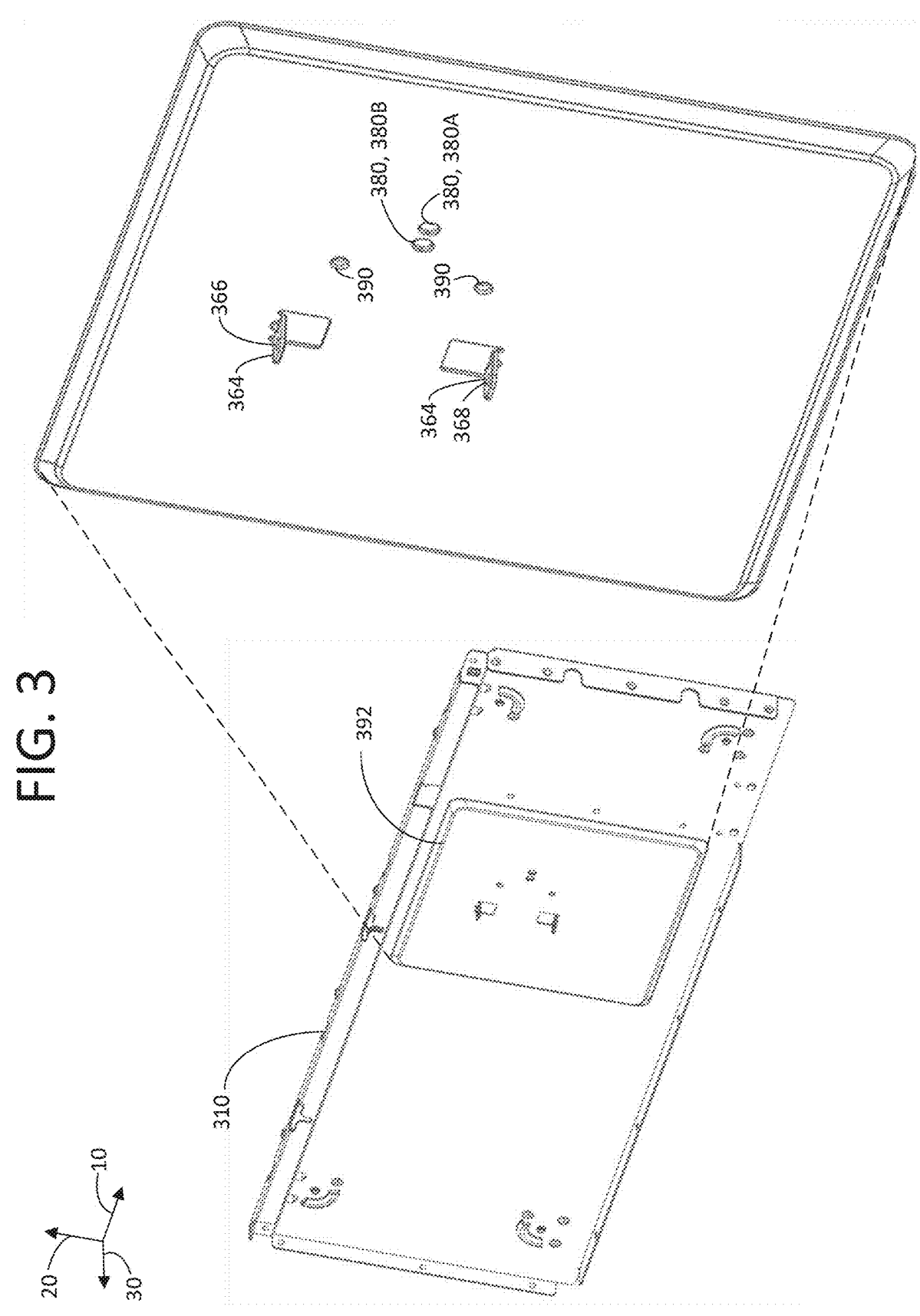
FIG. 3 illustrates a perspective side view of a vertical support panel of an information processing device according to an example implementation of the present disclosure.

The actuator tab 238 may be configured to be disposed between a set of pivot tabs 364 (as shown in FIG. 4A) of the vertical support panel 310 and movably coupled to the vertical support panel 310 by fasteners 242 (as shown in FIG. 2E) inserted through the set of slots 250 and, in a movably coupled state of the actuator tab 238 to the vertical support panel 310, the slots 250 guide and constrain sliding movement of the actuator tab 238 relative to the vertical support panel 310. Further, the handle section 246 may be pulled to slide the actuator tab 238 along a first direction 40 or pushed to slide the actuator tab 238 along a second direction 60 opposite to the first direction 40 relative to the vertical support panel 310. In such examples, the protrusion 276 in the handle section 246 may be configured to engage with one hole of a set of holes 380 (as shown in FIG. 3) of the vertical support panel to prevent sliding of the actuator tab 238 relative to the vertical support panel 310. Further, the handle section 246 may further elastically deform to remove the protrusion 276 from the one hole of the set of holes 380 and allow the sliding movement of the actuator tab 238 relative to the vertical support panel 310.

FIG. 2C depicts a perspective side view of a retention arm 240 of an electronic module retention assembly 408 (as shown in FIG. 4B.) FIG. 2D depicts another perspective side view of the retention arm 240 of FIG. 2C. In the description hereinafter, FIGS. 2C-2D are described concurrently for ease of illustration. The retention arm 240 is an example implementation of the retention arm 140 described above.

The retention arm 240 extends from a first end portion 252 to a second end portion 254 along a first dimension (e.g., a length dimension) of the retention arm 240 (which is parallel to axis 10 in a state shown in FIG. 2C.) In such examples, the first end portion 252 includes circular gear teeth 256 and the second end portion 254 includes an attachment element 258. In particular, the first end portion 252 has a rounded (e.g., semi-circular) profile and includes the circular gear teeth 256 at a center 152A of the first end portion 252, a first pivot pin 260 at a top end 252B of the first end portion 252, and a second pivot pin 262 at a bottom end 252C of the first end portion 252. The first pivot pin 260 and the second pivot pin 262 may be collectively referred to as a set of pivot pins. The second end portion 254 of the retention arm 240 includes the attachment element 258 such as a groove extending along a second dimension (e.g., height dimension) of the retention arm 240 (which is parallel to the axis 20 in a state shown in FIG. 2C) from a face 280 of the retention arm 240. The retention arm 240 further includes a set of protrusions 274 that extends perpendicularly from a rear face 282 of the retention arm 240 and disposed between the circular gear teeth 256 and the attachment element 258.

The retention arm 240 may be pivotably coupled to the vertical support panel 310 and mounted on the face 237 of the actuator tab 238 such that the circular gear teeth 256 and the linear gear teeth 248 are engaged with each other and a sliding movement of the actuator tab 238 relative to the vertical support panel 310 may cause rotation of the retention arm 240 between a deployed position and a stowed position. In particular, when the handle section 246 is pulled to slide the actuator tab 238 along the first direction 40 (as shown in FIGS. 2A-2B), the linear gear teeth 248 may drive the circular gear teeth 256 and rotate the retention arm 240 along a first rotational direction 50 to the deployed position. In some examples, in the deployed position, the retention arm 240 may be oriented such that the first dimension of the retention arm 240 is perpendicular to the vertical support panel 310 and the attachment element 258 may be positioned to engage with an electronic module (not shown) and secure the electronic module to an information processing device (not shown.) Further, when the handle section 246 is pushed to slide the actuator tab 238 along the second direction 60 (as shown in FIGS. 2A-2B), the linear gear teeth 248 may drive the circular gear teeth 256 and rotate the retention arm 240 along a second rotational direction 70 (opposite the first rotational direction 50) from the deployed position to the stowed position. In some examples, in the stowed position, the retention arm 240 may be oriented such that the first dimension of the retention arm 240 may be parallel to the vertical support panel 310 and the attachment element 258 may be positioned to disengage from the electronic module and release the electronic module to the information processing device. In such examples, in the stowed position, the set of protrusions 274 of the retention arm 240 may further engage with the set of openings 270 in the actuator tab 238 to hold the retention arm 240 in the parallel position relative to the vertical support panel 310.

FIG. 2E depicts a perspective side view of a fastener 242 of an electronic module retention assembly 408 (as shown in FIG. 4B.) In some examples, the fastener 242 is a step screw, including a head portion 284, a shank portion 286, and an end portion 288. The head portion 284 allows a driver member (not shown) to fasten and unfasten the fastener 242. The shank portion 286 is a plan section having no screw threads and interconnecting the head portion 284 to the end portion 288. Further, the end portion 288 has screw threads for engaging with a set of openings 390 (as shown in FIGS. 3 and 4A) of the vertical support panel 310, and thereby movably coupling the actuator tab 238 to the vertical support panel 310. In some examples, the shank portion 286 of the fastener 242 may allow the actuator tab 238 to slide between the stowed position and the deployed position relative to the vertical support panel 310.

Figure 6A:
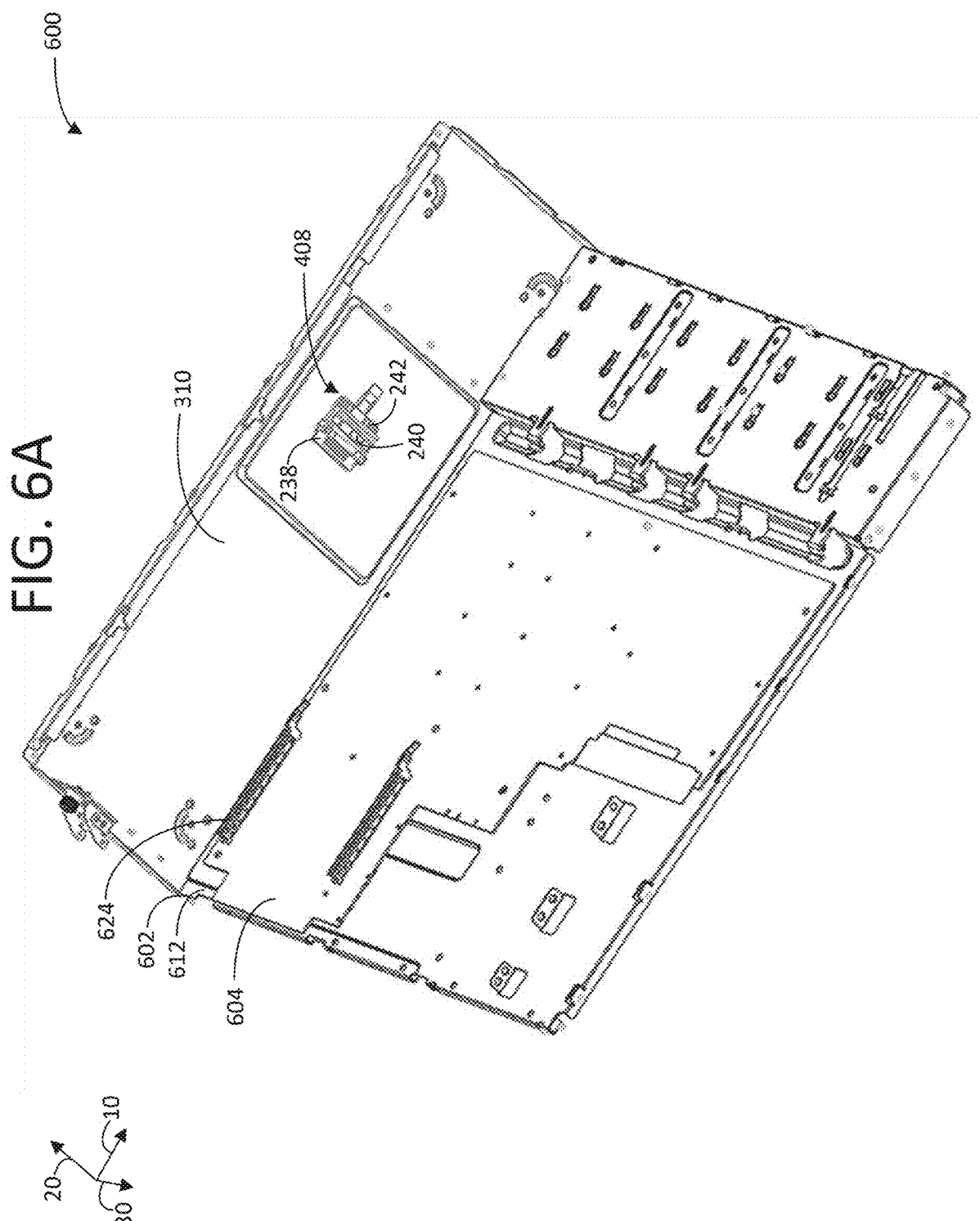
FIG. 6A illustrates a portion of an information processing device having the vertical support panel and the electronic module retention assembly of FIG. 4B according to an example implementation of the present disclosure.

FIG. 3 depicts a perspective side view of a vertical support panel 310 of an information processing device 600 (as shown in FIG. 6A.) In some examples, the vertical support panel 310 is a sidewall of a chassis 602 (as shown in FIG. 6A) of the information processing device. In some other examples, the vertical support panel 310 may be a drive cage, a PSU cage, or an internal divider wall of the chassis 602. The vertical support panel 310 includes a plurality of features such as a set of pivot tabs 364, a set of holes 380, and a set of openings 390. It some examples, the plurality of features are formed on a raised platform 392 disposed adjacent to one of a peripheral end portion 394 of the vertical support panel 310. It may be noted that the plurality of features may be formed anywhere on the vertical support panel 310 based on a form factor of an electronic module (not shown) which the electronic module retention assembly 408 may have to secure to the chassis 602. In some examples, the set of pivot tabs 364 are disposed spaced apart from each other along the second dimension (e.g., a height dimension) of the vertical support panel 310 (which is parallel to axis 20 in a state shown in FIG. 3.) The set of holes 380 are disposed spaced apart from each other along the first dimension (e.g., a length dimension) of the vertical support panel 310 (which is parallel to axis 10 in a state shown in FIG. 3) and located at center relative to the set of pivot tabs 364. Further, the set of openings 390 are located between the set of pivot tabs 364 and set of holes 380 and are disposed spaced apart from each other along the second dimension (e.g., the height dimension) of the vertical support panel 310. In some examples, each pivot tab 365 includes a pivot hole 366 configured to engage with a corresponding pivot pin 260 (as shown in FIG. 2A) to pivotably couple the retention arm 240 to the vertical support panel 310.

FIG. 4A depicts a perspective side view of the actuator tab 238 of FIGS. 2A-2B movably coupled to the vertical support panel 310 of FIG. 3. The actuator tab 238 is disposed on the vertical support panel 310 such that body section 244 is positioned between the set of pivot tabs 364 and the set of slots 250 of the body section 244 is aligned with the set of openings 390 (as shown in FIG. 3) of the vertical support panel 310. In such examples, the actuator tab 238 is oriented parallel to the vertical support panel 310 along the first dimension. Further, the actuator tab 238 is movably coupled to the vertical support panel 310. In some examples, a pair of fasteners 242 is inserted (e.g., threaded) into the set of openings 390 through the set of slots 250 to movably couple the actuator tab 238 to the vertical support panel 310. In some examples, the shank portion 286 (as shown in FIG. 2E) of each fastener 242 may allow the actuator tab 238 to slide along the first dimension within a width of a corresponding slot of the set of slots 250 to move between the stowed position and the deployed position relative to the vertical support panel 310. In the example of FIG. 4A, the actuator tab 238 is shown in the stowed position.

FIG. 4B depicts a perspective side view of the retention arm 240 of FIGS. 2C-2D pivotably coupled to the vertical support panel 310 and mounted on a face 237 of the actuator tab 238 of FIG. 4A to define an electronic module retention assembly 408. In some examples, the retention arm 240 is pivotably coupled to the vertical support panel 310 and rotatably coupled to the actuator tab 238. In particular, the first pivot pin 260 of the actuator tab 238 is engaged with the first pivot hole 266 of the vertical support panel 110, and the second pivot pin 262 (as shown in FIG. 2C) of the retention arm 240 is engaged with the second pivot hole 268 (as shown in FIG. 3) of the vertical support panel 210 to pivotably couple the retention arm 240 to the vertical support panel 310. Further, the retention arm 240 is mounted on the face 237 of the actuator tab 238 such that the circular gear teeth 256 and the linear gear teeth 248 are engaged with each other, and thereby rotatably couple the retention arm

240 to the actuator tab 238. In such examples, a sliding movement of the actuator tab 238 relative to the vertical support panel 310 causes rotation of the retention arm 240 between the deployed position and the stowed position. In the example of FIG. 4B, the retention arm 240 is shown in the stowed position. Particularly, in the stowed position, the first dimension of the retention arm 240 is parallel to the vertical support panel 310. More particularly, the actuator tab 238, the retention arm 240, and the vertical support panel 310 are positioned in a straight angle along the axis 10. In other words, the attachment element 258 of the retention arm 240 is positioned away from an internal volume of the chassis 602 in order to clear a path to the internal volume of the chassis 602 and thereby allowing installation of an electronic module and/or a primary system board in the chassis 602. In such examples, in the stowed position, the set of protrusions 274 (as shown in FIG. 2C) of the retention arm 240 engages with the set of openings 270 (as shown in FIG. 2A) of the actuator tab 238 to hold the retention arm 240 in the parallel position relative to the vertical support panel 310. Further, in the stowed position, the protrusion 276 (as shown in 2B) of the handle section 246 engages with a first hole 380A (as shown in FIG. 3) of a set of holes 380 of the vertical support panel to prevent sliding of the actuator tab 238 relative to the vertical support panel 310.

Figure 5:
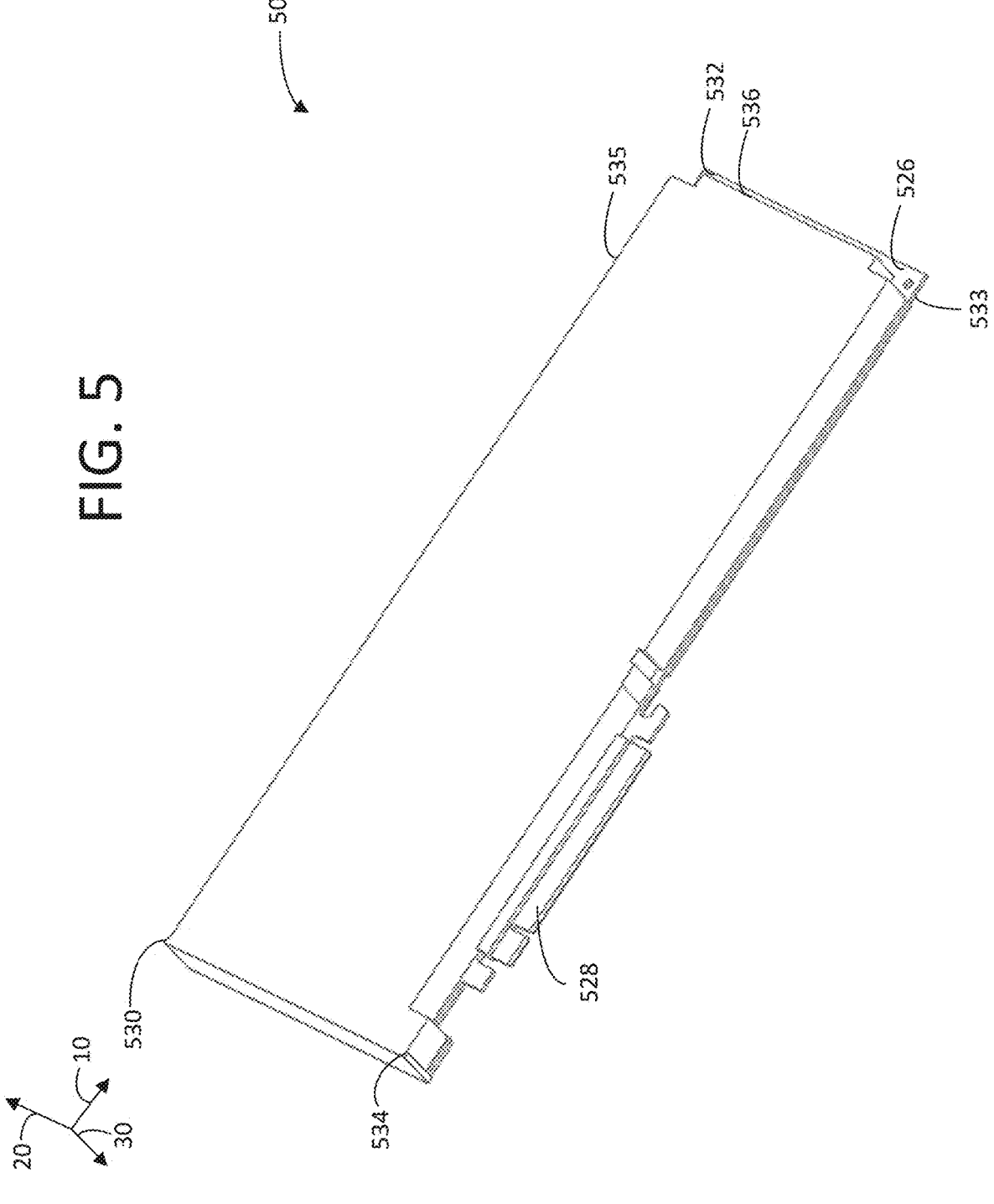
FIG. 5 illustrates a perspective view of an electronic module according to an example implementation of the present disclosure.

FIG. 5 depicts a perspective view of an electronic module 506. The electronic module 506 may be an expansion card (e.g., a graphics processing unit (GPU) card), a riser card (e.g., an intermediary card), or the like. The electronic module 506 includes a circuit board 526 and a second electrical connector 128. In some examples, the electronic module 506 further includes a bracket 530, an extension element 532, and a cooling component 535. In the example of FIG. 5, the extension element 532 is an extended portion of the circuit board 526. In one or more examples, the second electrical connector 528 is positioned at a bottom edge 533 of the electronic module 506, the bracket 530 is positioned at a first peripheral side 534 of the electronic module 506, and the extension element 532 is positioned at a second peripheral side 536 opposite to the first peripheral side 534 of the electronic module 506. In one or more examples, the second electrical connector 528 may a PCI-e edge connector having a profile complementary to the profile of the PCI-e expansion slot of a primary system board 604 (as shown in FIG. 6A) or a M-IXO connector having a profile complementary to the profile of the M-IXO socket of the primary system board 104. The cooling component 535 contains the circuit board 526. In some examples, the electronic module 306 may be vertically oriented and mounted on the primary system board 604 such that the second electrical connector 528 is detachably connected to a first electrical connector 624 (as shown in FIG. 6A) of the primary system board 604 and the circuit board 526 of the electronic module 506 is parallel to the vertical support panel 310. In some examples, after the electronic module 506 is detachably connected to the first electrical connector 624, the bracket 530 may be coupled to a rear panel of the chassis 602 to secure the first peripheral side 534 of the electronic module 506 to the chassis 602 and the second peripheral side 536 may be secured by the electronic module retention assembly 408, as discussed in detail below.

FIG. 6A depicts a portion of an information processing device 600. In some examples, the information processing device 600 includes a chassis 602, a primary system board 604, and an electronic module retention assembly 408 of FIG. 4B. The chassis 602 includes a base 612 and a vertical support panel 310 disposed perpendicular to and coupled to the base 612. The primary system board 604 is coupled to the base 612 and includes a first electrical connector 624. The electronic module retention assembly 408 includes an actuator tab 238, a retention arm 240, and a set of fasteners 242, as discussed herein in the example of FIGS. 2A-2E. In one or more examples, the electronic module retention assembly 408 may be a holder assembly, which may be configured to releasably secure an electronic module 506 (as shown in FIG. 5) to the information processing device 600. In particular, the electronic module retention assembly 408 may be configured to secure a second peripheral side 536 (as shown in FIG. 5) of the electronic module 506 to the information processing device 500.

Figure 6B:
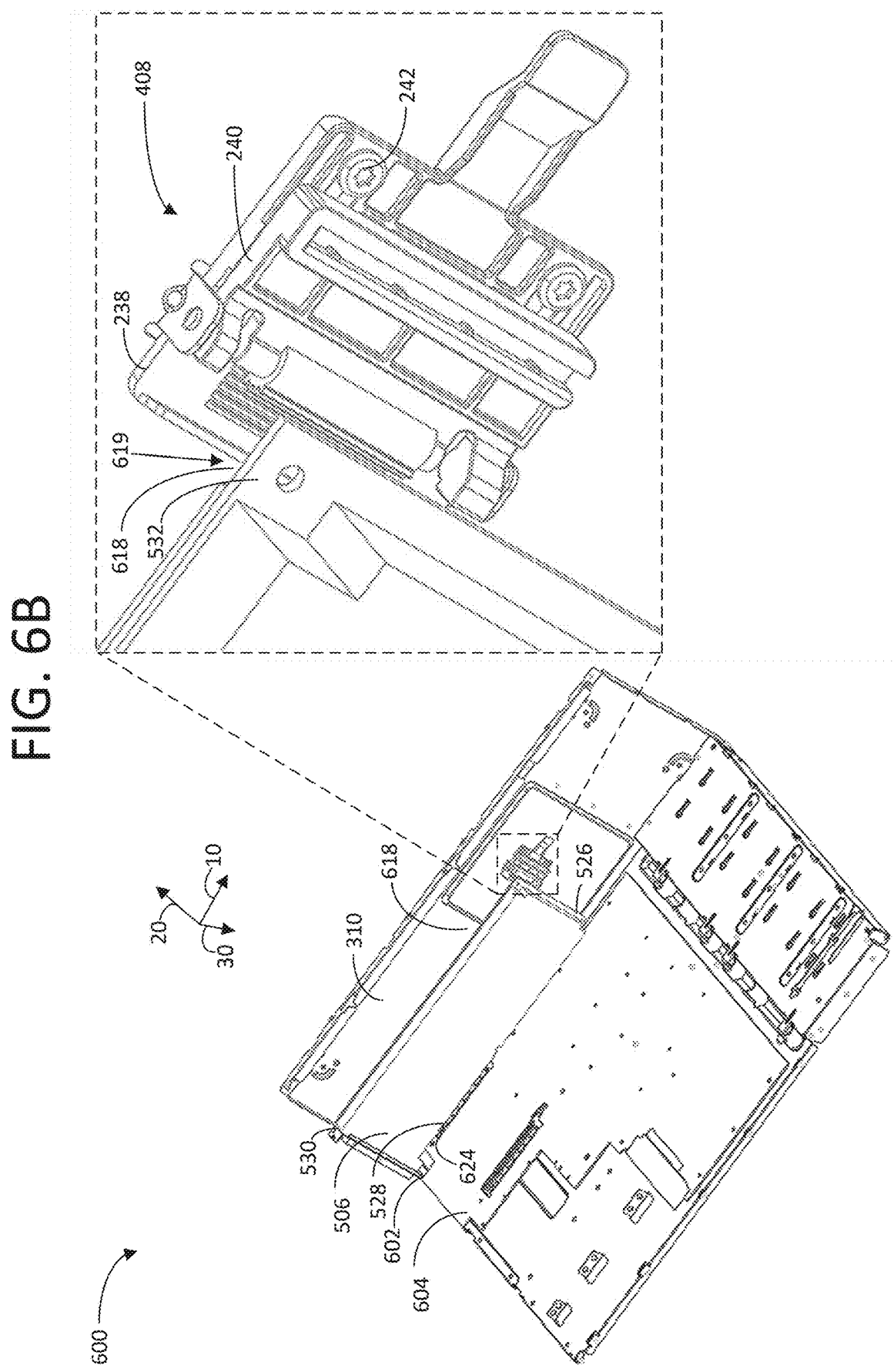
FIG. 6B illustrates a portion of the information processing device of FIG. 6A having the electronic module retention assembly in a stowed position according to an example implementation of the present disclosure.

FIG. 6B depicts a portion of the information processing device 600 having an electronic module 506 of FIG. 5 and the electronic module retention assembly 408 in a stowed position. The electronic module 506 is vertically oriented and mounted on the primary system board 604 such that the second electrical connector 528 of the electronic module 506 is detachably connected to the first electrical connector 624 of the primary system board 604. In such examples, the circuit board 526 of the electronic module 506 is oriented parallel to the vertical support panel 310. Further, the bracket 530 of the electronic module 506 may be positioned adjacent to a rear panel (not shown) of the chassis 602 and the extension element 532 of the electronic module 506 is positioned adjacent to the electronic module retention assembly 408. In such examples, after the electronic module 506 is detachably connected to the primary system board 604, the bracket 530 may be coupled to the rear panel to secure the first peripheral side 534 (as labeled in FIG. 5) of the electronic module 506 to the chassis 602 and the extension element 532 may be releasably coupled to the electronic module retention assembly 408 to secure the second peripheral side 536 (as labeled in FIG. 5) of the electronic module 506 to the chassis 602, as discussed in detail below. In the example of FIG. 6B, the electronic module retention assembly 408 is in a stowed position. In particular, in the stowed position, the first dimension of the retention arm 240 of the electronic module retention assembly 408 is parallel to the vertical support panel 310. More particularly, the actuator tab 238 of the electronic module retention assembly 408, the retention arm 240 of the electronic module retention assembly 408, and the vertical support panel 310 of the chassis 602 are positioned adjacent to each other in a straight angle along the axis 10. In other words, the retention arm 240 of the electronic module retention assembly 408 is positioned away from an internal volume 618 of the chassis 602 in order to clear a path 619 to the internal volume 618 of the chassis 602, and thereby allowing installation of an electronic module 506 and/or the primary system board 604 in the chassis 602. Further, in the stowed position, the protrusion 276 (as shown in 2B) of the handle section 246 of the electronic module retention assembly 408 engages with a first hole 380A (as shown in FIG. 3) of a set of holes 380 of the vertical support panel 310 to prevent sliding of the actuator tab 238 relative to the vertical support panel 310.

Figure 6C:
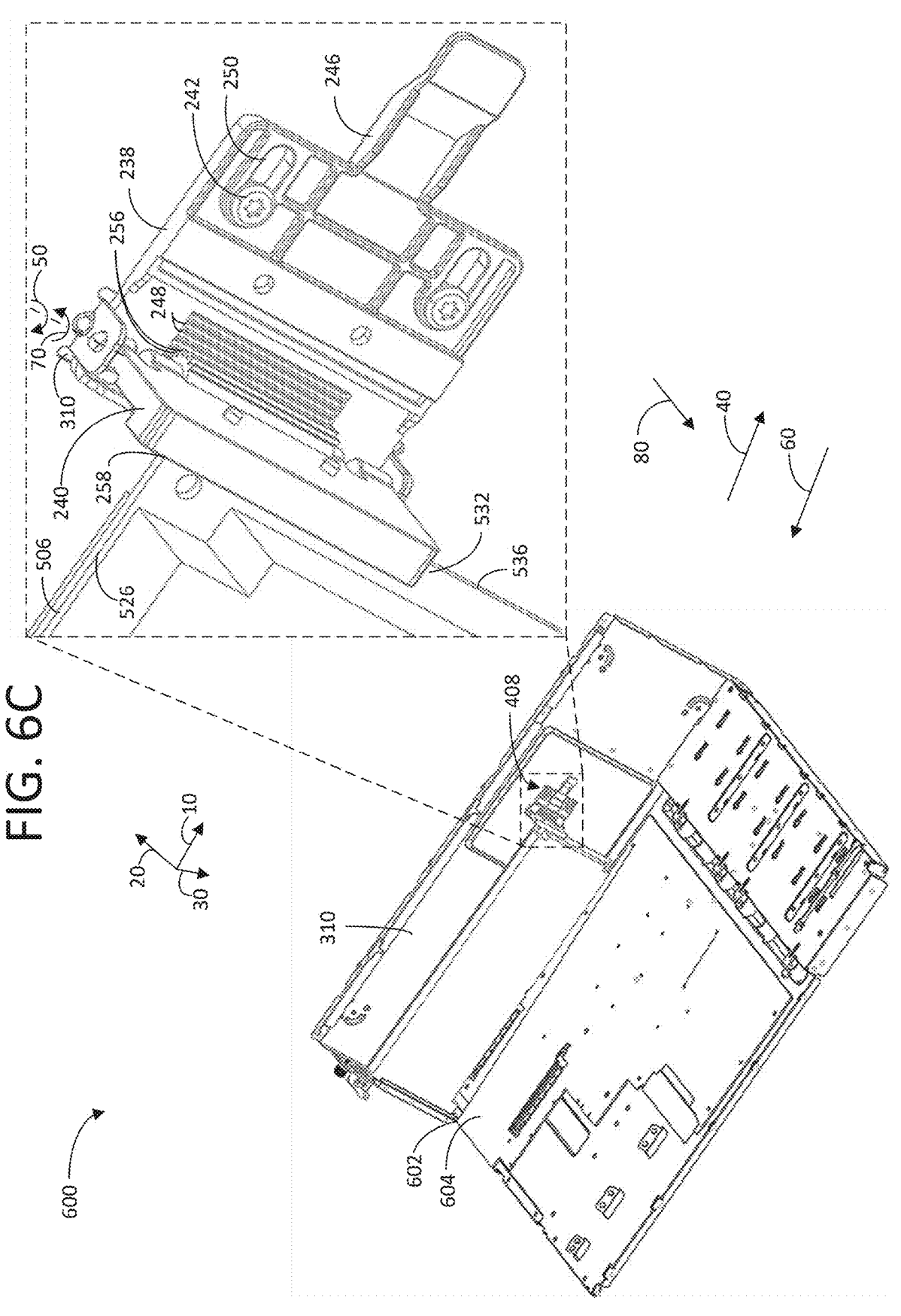
FIG. 6C illustrates a portion of the information processing device having the electronic module retention assembly of FIG. 6B transitioned from the stowed position to a deployed position according to an example implementation of the present disclosure.

FIG. 6C depicts a portion of the information processing device 600 having the electronic module retention assembly 408 of FIG. 6B transitioned from the stowed position to a deployed position. In some examples, the handle section 246 of the electronic module retention assembly 408 is pulled along a third direction 80 to elastically deform the handle section 246 and remove the protrusion 276 (as shown in FIG. 2B) of the handle section 246 from the first hole 380A (as shown in FIG. 3) of the vertical support panel 310, and thereby allowing the actuator tab 238 to slide relative to the vertical support panel 310. In particular, after the protrusion 276 is detached from the first hole 380A, the handle section 246 is pulled along the first direction 40 to slide the actuator tab 238 along the vertical support panel 310 and cause the retention arm 240 to rotate along a first rotational direction 50 and thereby transitioning the electronic module retention assembly 408 from the stowed position to the deployed position. In particular, when the handle section 246 is pulled to slide the actuator tab 238 along the first direction 40, the linear gear teeth 248 drives the circular gear teeth 256 and rotates the retention arm 240 along the first rotational direction 50 from the stowed position to the deployed position. In some examples, in the deployed position, the retention arm 240 is oriented such that the first dimension of the retention arm 240 is perpendicular to the vertical support panel 310 and the attachment element 258 is positioned to engage with the electronic module 506 and secure the electronic module 506 to the information processing device 600. In particular, the attachment element 258 is engaged with the extension element 532 of the circuit board 526 to releasably secure the electronic module 506 to the information processing device 600. Hence, the electronic module retention assembly 408 secures the second peripheral side 536 of the electronic module 506 and prevents the electronic module 506 from getting dislodged from the primary system board 604. In some examples, in the deployed position, the protrusion 276 (as shown in 2B) of the handle section 246 of the electronic module retention assembly 408 engages with a second hole 380B (as shown in FIG. 3) of the set of holes 380 of the vertical support panel 310 to prevent sliding of the actuator tab 238 relative to the vertical support panel 310.

Even though not illustrated, in one or more examples, the electronic module retention assembly 408 may be further transitioned from the deployed position to the stowed position. For example, the handle section 246 of the electronic module retention assembly 408 may be further pushed along the third direction 80 to elastically deform the handle section 246 and remove the protrusion 276 of the handle section 246 from the second hole 380B of the vertical support panel 310, and thereby allowing the actuator tab 238 to slide relative to the vertical support panel 310. In particular, after the protrusion 276 is detached from the second hole 380B, the handle section 246 may be pushed along the second direction 60 to slide the actuator tab 238 along the vertical support panel 310 and cause the retention arm 240 to rotate along a second rotational direction 70 and thereby transitioning the electronic module retention assembly 408 from the deployed position to the stowed position. In particular, when the handle section 246 is pushed to slide the actuator tab 238 along the second direction 60, the linear gear teeth 248 drives the circular gear teeth 256 and rotates the retention arm 240 along the second rotational direction 70 from the deployed position to the stowed position. In some examples, in the stowed position, the retention arm 240 may be oriented such that the first dimension of the retention arm 240 is parallel to the vertical support panel 310 and the attachment element 258 is positioned to disengage from the electronic module 506 and release the electronic module 506 from the information processing device 600. In particular, the attachment element 258 may be disengaged from the extension element 532 of the circuit board 526 to release the electronic module 506 from the information processing device 600.

Figures 7A, 7B, 7C:
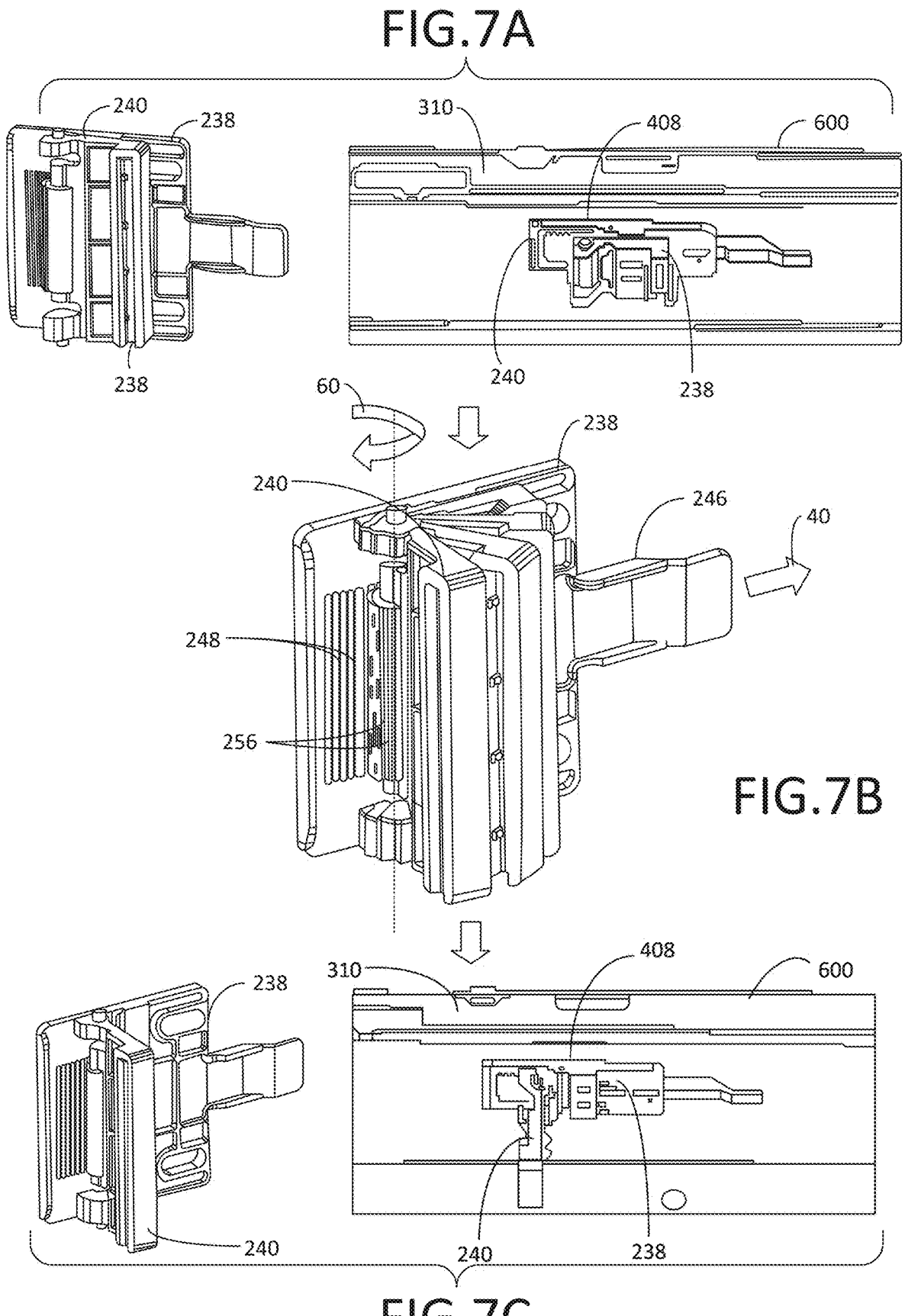
FIGS. 7A-7C illustrate a plurality of steps of transitioning an electronic module retention assembly from a stowed position to a deployed position to secure an electronic module to an information processing device according to an example implementation of the present disclosure.

FIGS. 7A-7C depict a plurality of steps of transitioning an electronic module retention assembly 408 of FIG. 4B from a stowed position to a deployed position to secure an electronic module to an information processing device 600. It may be noted that the electronic module is not shown herein so as to illustrate other components of the information processing device 600. Referring to FIG. 7A, the electronic module retention assembly 408 is in the stowed position. In some examples, in the stowed position, a first dimension of the retention arm 240 of the electronic module retention assembly 408 is parallel to the vertical support panel 310 and the attachment element 258 of the retention arm 240 is positioned to be disengaged from the electronic module and release the electronic module from the information processing device 600. Referring to FIG. 7B, the handle section 246 of the actuator tab 238 is pulled along the first direction 40 to slide the actuator tab 238 and cause the linear gear teeth 248 to drive the circular gear teeth 256 and rotate the retention arm 240 along a first rotational direction 50 from the stowed position to the deployed position. Referring to FIG. 7C, in the deployed position, the first dimension of the retention arm 240 of the electronic module retention assembly 408 is perpendicular to the vertical support panel 310 and the attachment element 258 of the retention arm 240 is positioned to engage with the electronic module and secure the electronic module to the information processing device 600.

Figures 7D, 7E, 7F:
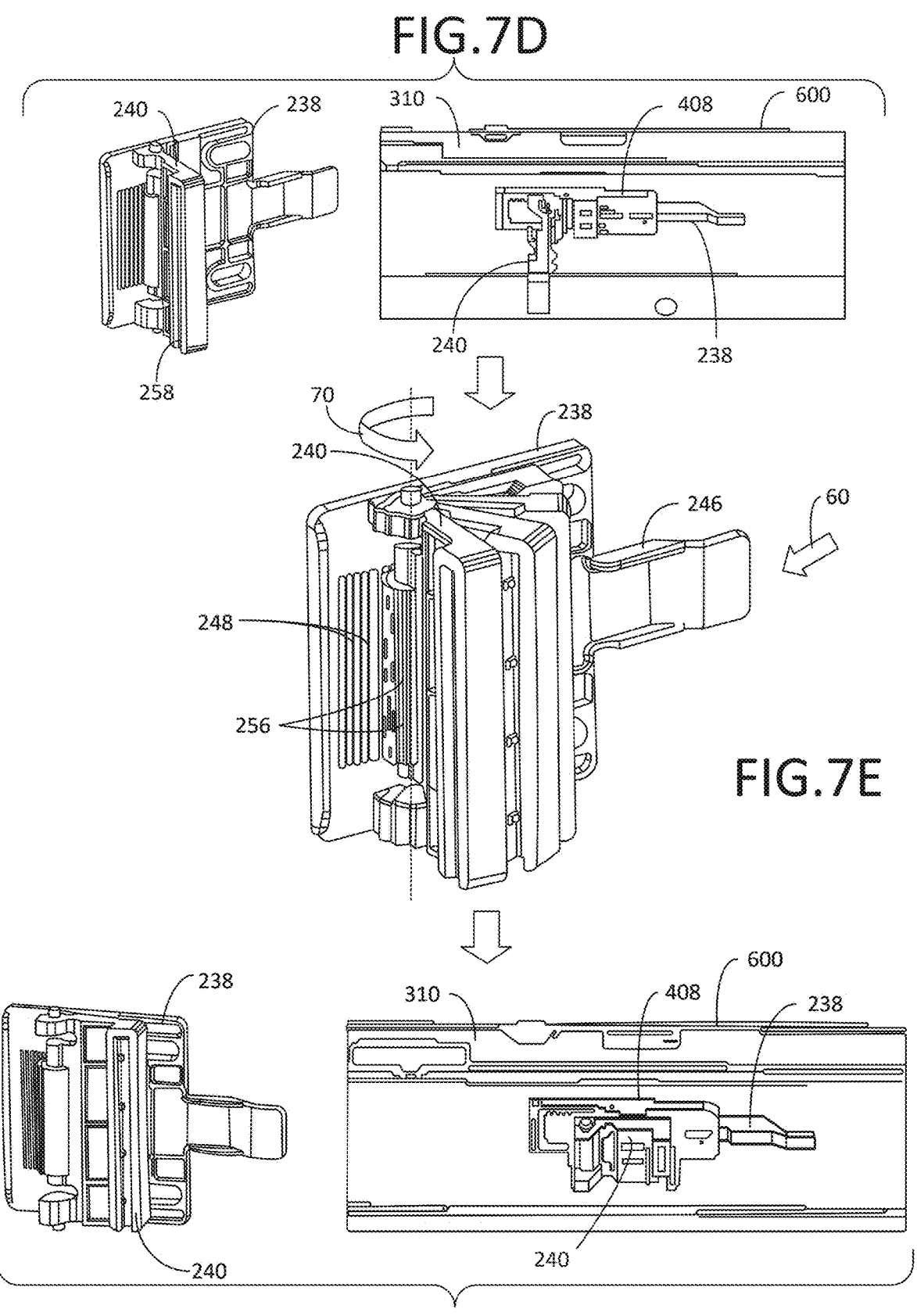
FIGS. 7D-7F illustrate a plurality of steps of transitioning an electronic module retention assembly from a deployed position to a stowed position to release an electronic module from an information processing device according to an example implementation of the present disclosure.

FIGS. 7D-7F depict a plurality of steps of transitioning an electronic module retention assembly 408 of FIG. 4B from a deployed position to a stowed position to release an electronic module from an information processing device 600. It may be noted that the electronic module is not shown herein so as to illustrate other components of the information processing device 600. Referring to FIG. 7D, the electronic module retention assembly 408 is in the deployed position. In some examples, in the deployed position, the first dimension of the retention arm 240 of the electronic module retention assembly 408 is perpendicular to the vertical support panel 310 and the attachment element 258 of the retention arm 240 is positioned to engage with the electronic module and secure the electronic module to the information processing device 600. Referring to FIG. 7E, the handle section 246 of the actuator tab 238 is pushed along the second direction 60 to slide the actuator tab 238 and cause the linear gear teeth 248 to drive the circular gear teeth 256 and rotate the retention arm 240 along a second rotational direction 70 from the deployed position to the stowed position. Referring to FIG. 7F, in the stowed position, the first dimension of the retention arm 240 of the electronic module retention assembly 408 is parallel to the vertical support panel 310 and the attachment element 258 of the retention arm 240 is positioned to be disengaged from the electronic module and release the electronic module from the information processing device 600.

Figures 8A, 8B, 8C:
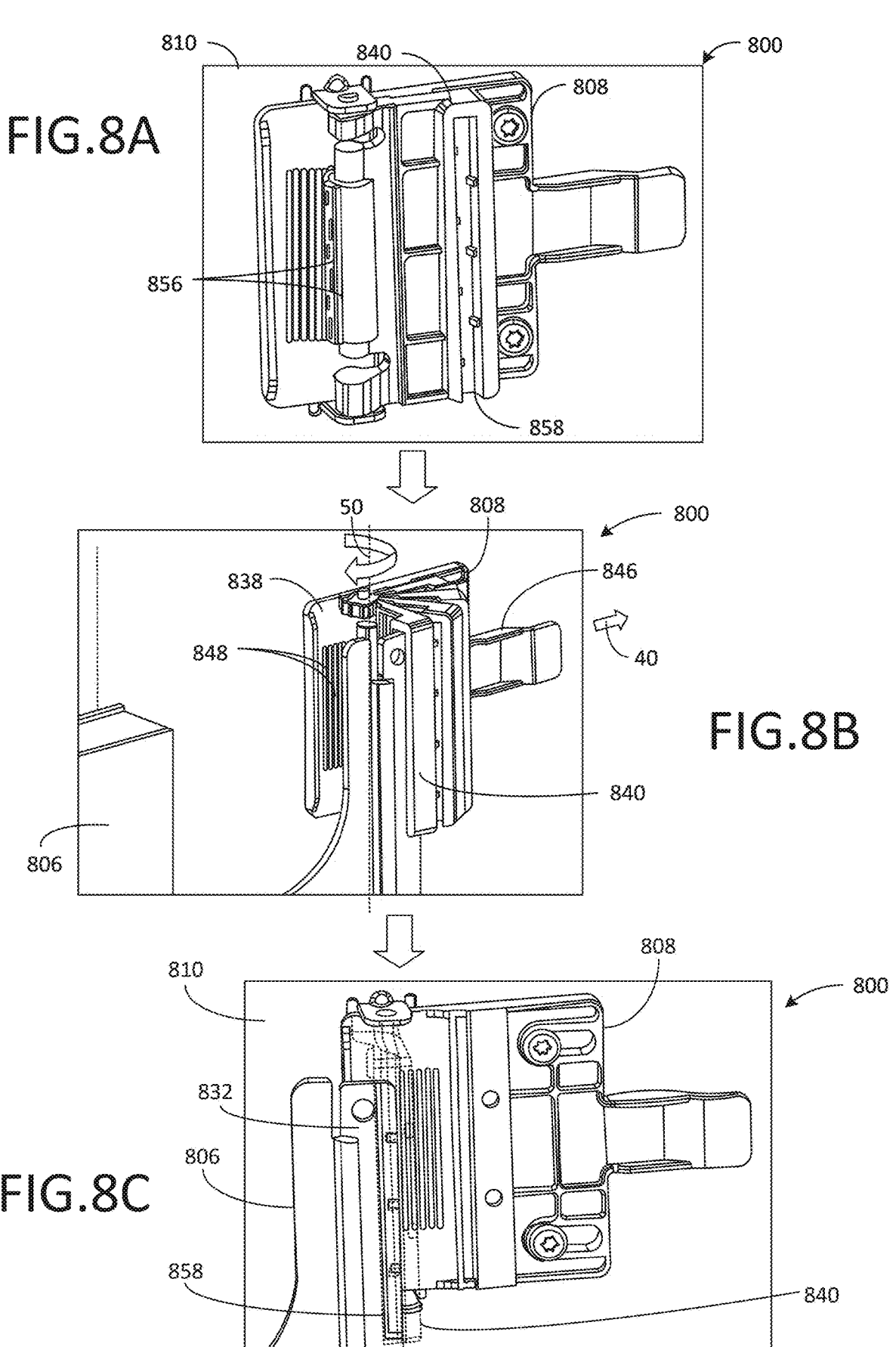
FIGS. 8A-8C illustrate a plurality of steps of transitioning an electronic module retention assembly from a stowed position to a deployed position to secure another electronic module to an information processing device according to an example implementation of the present disclosure.

FIGS. 8A-8C depicts a plurality of steps of transitioning an electronic module retention assembly 808 from a stowed position to a deployed position to secure an electronic module 806 to an information processing device 800. The electronic module retention assembly 808 is substantially similar to an electronic module retention assembly 408 (as shown in FIG. 4B.) Hence the electronic module retention assembly 808 is not discussed in greater detail herein. Referring to FIG. 8A, the electronic module retention assembly 808 is in the stowed position. In some examples, in the stowed position, a retention arm 840 of the electronic module retention assembly 808 is parallel to a vertical support panel 810 and an attachment element 858 of a retention arm 840 is positioned to be disengaged from the electronic module 806 (as shown in FIG. 8B) and release the electronic module 806 from the information processing device 800. Referring to FIG. 8B, a handle section 846 of the actuator tab 838 is pulled along the first direction 40 to slide the actuator tab 838 and cause the linear gear teeth 848 to drive the circular gear teeth 856 (as shown in FIG. 8A) and rotate the retention arm 840 along a first rotational direction 50 from the stowed position to the deployed position. Referring to FIG. 8C, in the deployed position, the retention arm 840 of the electronic module retention assembly 808 is perpendicular to the vertical support panel 810 and the attachment element 858 of the retention arm 840 is positioned to engage with the electronic module 806 and secure the electronic module 806 to the information processing device 800. In the example of FIG. 8A, the attachment element 858 is engaged with an extension element 832 (e.g., an extension bracket) of the electronic module 806 to secure a second peripheral side 834 of the electronic module 806 to the information processing device 800.

FIG. 9 is a flowchart depicting a method 900 releasably securing an electronic module to an information processing device using an electronic module retention assembly. It may be noted herein that the method 900 is described in conjunction with FIGS. 2A-2E, 3, 4A-4B, 5, 6A-6C, and 7A-7F for example. The method 900 starts at block 902 and continues to block 904.

The method 900 starts at block 902 and continues to block 904. At block 904, the method 900 includes sliding an actuator tab of an electronic module retention assembly along a vertical support panel of the information processing device and causing a retention arm of the electronic module retention assembly, movably coupled the actuator tab to rotate between a deployed position and a stowed position. In some examples, the actuator tab includes linear gear teeth which is movably coupled to the vertical support panel. The retention arm extends from a first end portion to a second end portion along a first dimension. The first end portion includes circular gear teeth, and the second end portion includes an attachment element configured to releasably couple to the electronic module. The retention arm being pivotably coupled to the vertical support panel and mounted on a face of the actuator tab such that the circular gear teeth and the linear gear teeth are engaged with each other to movably couple the retention arm to the actuator tab. The method 900 continues to block 906.

At block 906, the method 900 includes a sub-step of pulling the actuator tab along a first direction to cause the linear gear teeth to drive the circular gear teeth and rotate the retention arm along a first rotational direction to the deployed position. In some examples, in the deployed position, the retention arm is oriented such that the first dimension of the retention arm is perpendicular to the vertical support panel and the attachment element is engaged with the electronic module and secure the electronic module to the information processing device. The method 900 continues to block 908.

At block 908, the method 900 another sub-step of pushing the actuator tab along a second direction opposite to the first direction to cause the linear gear teeth to drive the circular gear teeth and rotate the retention arm along a second rotational direction to the stowed position. In some examples, in the stowed position, the retention arm is oriented such that the first dimension of the retention arm is parallel to the vertical support panel and the attachment element is disengaged from the electronic module and release the electronic module from the information processing device. The method 900 ends at block 910.

Various features as illustrated in the examples described herein may be implemented in an information processing device having an electronic module retention assembly. Accordingly, the electronic module retention assembly may releasably secure an electronic module (e.g., an expansion card or a riser card) to the information processing device. The electronic module retention assembly of the present disclosure may include components such as the actuator tab that is slidable relative to the vertical support panel, and the retention arm that is rotatable relative to the actuator tab, thereby allowing the retention arm to be oriented perpendicularly from the vertical support frame to secure the electronic module, or to be oriented parallel (and adjacent) to the vertical support frame to allow insertion/removal of the electronic module, the primary system board, and/or other components into or out of the chassis. In contrast, in alternative approaches, the clamp may include an immovable element, which may remain stationary in the internal volume, thereby obstructing insertion/removal of the electronic module, the primary system module, and/or other components into or out of the chassis. The electronic module retention assembly utilizes a linear motion to a rotary motion conversion technique for transitioning between the stowed position and the deployed position, thus, the electronic module retention assembly may be manufactured using simple mechanical components such as a slidable actuation tab and a rotatable retention arm. Further, such mechanical components may be produced using simple manufacturing techniques such as a sheet metal stamping, an injection molding, or the like. Additionally, the electronic module retention assembly may be manufactured using thermoplastic materials or polymer materials, which may be cost-effective. Further, the electronic module retention assembly may be easily assembled by engaging the actuator tab and the retention arm with each other, and with the vertical support panel, thus the electronic module retention assembly may be easily deployed anywhere in the chassis. Additionally, the retention arm may be moved to the stowed position when not in use, thus, the electronic module retention assembly occupies less space and can be deployed in areas with less space in the chassis. Further, the electronic module retention assembly does not have to be removed from the chassis to allow insertion/removal of the electronic module from the chassis, thereby making the installation/removal process faster and easier and providing users the flexibility of not needing tools (in contrast to the clamp described above.)

In the foregoing description, numerous details are set forth to provide an understanding of the subject matter disclosed herein. However, an implementation may be practiced without some or all of these details. Other implementations may include modifications, combinations, and variations from the details discussed above. It is intended that the following claims cover such modifications and variations.

What is claimed is:

1. An electronic module retention assembly comprising:
an actuator tab comprising linear gear teeth, configured to be movably coupled to a vertical support panel of an information processing device and configured to slide along the vertical support panel; and
a retention arm extending from a first end portion to a second end portion along a first dimension of the retention arm, the first end portion comprising circular gear teeth and the second end portion comprising an attachment element configured to releasably couple to an electronic module, the retention arm being pivotably coupled to the vertical support panel and mounted on a face of the actuator tab such that the circular gear teeth and the linear gear teeth are engaged with each other and a sliding movement of the actuator tab relative to the vertical support panel causes rotation of the retention arm between a deployed position and a stowed position,
wherein, in the deployed position, the retention arm is oriented such that the first dimension of the retention arm is perpendicular to the vertical support panel and the attachment element is positioned to engage with the electronic module and secure the electronic module to the information processing device, and
wherein, in the stowed position, the retention arm is oriented such that the first dimension of the retention arm is parallel to the vertical support panel and the attachment element is positioned to be disengaged from the electronic module and release the electronic module from the information processing device.

2. The electronic module retention assembly of claim 1, wherein the actuator tab comprises a body section and a handle section extending from the body section, wherein the body section comprises the linear gear teeth, wherein the handle section comprises a protrusion that extends perpendicularly from a rear face of the handle section and configured to, in a movably coupled state of the actuator tab to the vertical support panel, engage holes in the vertical support panel to prevent sliding of the actuator tab relative to the vertical support panel, wherein the handle section is elastically deformable to remove the protrusion from the holes to allow sliding of the actuator tab relative to the vertical support panel.

3. The electronic module retention assembly of claim 2, wherein the handle section is pulled to slide the actuator tab along a first direction to cause the linear gear teeth to drive the circular gear teeth and rotate the retention arm along a first rotational direction to the deployed position.

4. The electronic module retention assembly of claim 3, wherein the handle section is pushed to slide the actuator tab along a second direction opposite to the first direction to cause the linear gear teeth to drive the circular gear teeth and rotate the retention arm along a second rotational direction opposite the first rotational direction to the stowed position.

5. The electronic module retention assembly of claim 1, wherein the actuator tab further comprises a set of slots, wherein the actuator tab is configured to be disposed between pivot tabs of the vertical support panel and movably coupled to the vertical support panel by fasteners inserted through the slots and, in a movably coupled state of the actuator tab to the vertical support panel, the slots guide and constrain sliding movement of the actuator tab relative to the vertical support panel.

6. The electronic module retention assembly of claim 1, wherein the first end portion of the retention arm further comprises a set of pivot pins configured to engage with corresponding pivot tabs of the vertical support panel to pivotably couple the retention arm to the vertical support panel.

7. The electronic module retention assembly of claim 1, wherein the second end portion of the retention arm further comprises a set of protrusions, each extending perpendicularly from a rear face of the retention arm, wherein, in the stowed position, each protrusion of the set of protrusions is engaged to a corresponding opening of a set of openings of the actuator tab to hold the retention arm in a parallel position relative to the vertical support panel.

8. The electronic module retention assembly of claim 1, wherein the attachment element is a groove that is configured to engage with a circuit board or an extension bracket of the electronic module in the deployed position of the retention arm and secure the electronic module to the information processing device.

9. An information processing device comprising:
a chassis comprising a base and a vertical support panel perpendicular to and coupled to the base;
a primary system board coupled to the base, comprising a first electrical connector;
an electronic module comprising a circuit board and a second electrical connector, the electronic module is vertically oriented and mounted on the primary system board such that the second electrical connector is detachably connected to the first electrical connector such that the circuit board is parallel to the vertical support panel; and
an electronic module retention assembly comprising:
an actuator tab comprising linear gear teeth movably coupled to the vertical support panel and configured to slide along the vertical support panel; and
a retention arm extending from a first end portion to a second end portion along a first dimension of the retention arm, the first end portion comprising circular gear teeth and the second end portion comprising an attachment element configured to releasably couple to the electronic module, the retention arm being pivotably coupled to the vertical support panel and mounted on a face of the actuator tab such that the circular gear teeth and the linear gear teeth are engaged with each other and a sliding movement of the actuator tab relative to the vertical support panel causes rotation of the retention arm between a deployed position and a stowed position,
wherein, in the deployed position, the retention arm is oriented such that the first dimension of the retention arm is perpendicular to the vertical support panel and the attachment element is engaged with the electronic module and secure the electronic module to the chassis, and
wherein, in the stowed position, the retention arm is oriented such that the first dimension of the retention arm is parallel to the vertical support panel and the attachment element is disengaged from the electronic module and release the electronic module from the chassis.

10. The information processing device of claim 9, wherein the actuator tab comprises a body section and a handle section extending from the body section, wherein the body section comprises the linear gear teeth, wherein the handle section comprises a protrusion that extends perpendicularly from a rear face of the handle section and configured to, in a movably coupled state of the actuator tab to the vertical support panel, engage holes in the vertical support panel to prevent sliding of the actuator tab relative to the vertical support panel, and wherein the handle section is elastically deformable to remove the protrusion from the holes to allow sliding of the actuator tab relative to the vertical support panel.

11. The information processing device of claim 10, wherein the handle section is pulled to slide the actuator tab along a first direction to cause the linear gear teeth to drive the circular gear teeth and rotate the retention arm along a first rotational direction to the deployed position.

12. The information processing device of claim 11, wherein the handle section is pushed to slide the actuator tab along a second direction opposite to the first direction to cause the linear gear teeth to drive the circular gear teeth and rotate the retention arm along a second rotational direction opposite the first rotational direction to the stowed position.

13. The information processing device of claim 9, wherein the actuator tab comprises a set of slots, wherein the vertical support panel comprises pivot tabs spaced apart from each other along the third dimension, wherein the actuator tab is disposed between the pivot tabs and movably coupled to the vertical support panel by fasteners inserted through the slots and, in a movably coupled state of the actuator tab to the vertical support panel, the slots guide and constrain sliding movement of the actuator tab relative to the vertical support panel.

14. The information processing device of claim 9, wherein the vertical support panel comprises pivot tabs spaced apart from each other, and wherein the first end portion of the retention arm further comprises a set of pivot pins, each engaged with corresponding pivot tabs of the vertical support panel to pivotably couple the retention arm to the vertical support panel.

15. The information processing device of claim 9, wherein the second end portion of the retention arm further comprises a set of protrusions, each extending perpendicularly from a rear face of the retention arm, wherein, in the stowed position, each protrusion of the set of protrusions is engaged to a corresponding opening of a set of openings of the actuator tab to hold the retention arm in a parallel position relative to the vertical support panel.

16. The information processing device of claim 9, wherein the attachment element is a groove that is configured to engage with the circuit board or an extension bracket of the electronic module in the deployed position of the retention arm and secure the electronic module to the information processing device.

17. The information processing device of claim 9, wherein the electronic module is an expansion card or a riser card, and wherein each of the expansion card and the riser card is a peripheral component interconnect express (PCI-e) card.

18. The information processing device of claim 9, wherein the vertical support panel is one of a sidewall of the chassis, a sidewall of a drive cage, a sidewall of a PSU cage, or an internal divider wall of the chassis.

19. A method comprising:
sliding an actuator tab of an electronic module retention assembly along a vertical support panel of an information processing device and causing a retention arm of the electronic module retention assembly, movably coupled the actuator tab to rotate between a deployed position and a stowed position,
wherein the actuator tab comprises linear gear teeth movably coupled to the vertical support panel, wherein the retention arm extends from a first end portion to a second end portion along a first dimension of the retention arm, the first end portion comprises circular gear teeth and the second end portion comprises an attachment element configured to releasably couple to an electronic module, the retention arm being pivotably coupled to the vertical support panel and mounted on a face of the actuator tab such that the circular gear teeth and the linear gear teeth are engaged with each other to movably couple the retention arm to the actuator tab,
wherein, in the deployed position, the retention arm is oriented such that the first dimension of the retention arm is perpendicular to the vertical support panel and the attachment element is engaged with the electronic module and secure the electronic module to the information processing device, and wherein, in the stowed position, the retention arm is oriented such that the first dimension of the retention arm is parallel to the vertical support panel and the attachment element is disengaged from the electronic module and release the electronic module from the information processing device.

20. The method of claim 19, wherein sliding the actuator tab comprises:

pulling the actuator tab along a first direction to cause the linear gear teeth to drive the circular gear teeth and rotate the retention arm along a first rotational direction to the deployed position; and pushing the actuator tab along a second direction opposite to the first direction to cause the linear gear teeth to drive the circular gear teeth and rotate the retention arm along a second rotational direction to the stowed position.

\* \* \* \* \*